US012564064B2

(12) United States Patent
Fitzgerald et al.

(10) Patent No.: US 12,564,064 B2
(45) Date of Patent: Feb. 24, 2026

(54) RF BRIDGE

(71) Applicant: BAE Systems Information and Electronic Systems Integration Inc., Nashua, NH (US)

(72) Inventors: Jeffrey Fitzgerald, Lunenburg, MA (US); Wesley N. Allen, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 551 days.

(21) Appl. No.: 18/153,458

(22) Filed: Jan. 12, 2023

(65) Prior Publication Data

US 2024/0243079 A1    Jul. 18, 2024

(51) Int. Cl.
  *H01L 23/66*    (2006.01)
  *H01L 23/00*    (2006.01)
    (Continued)

(52) U.S. Cl.
  CPC ............ *H01L 23/66* (2013.01); *H01L 23/535* (2013.01); *H01L 23/5381* (2013.01);
    (Continued)

(58) Field of Classification Search
  CPC ...... H05H 7/02; H04B 10/2575; H04B 1/005; H04B 17/202; H04B 1/18; H04B 1/0458;
    (Continued)

(56) References Cited

U.S. PATENT DOCUMENTS

| | | |
|---|---|---|
| 6,366,185 B1 | 4/2002 | Keesey et al. |
| 7,012,489 B2 | 3/2006 | Sherrer et al. |

(Continued)

FOREIGN PATENT DOCUMENTS

| | | |
|---|---|---|
| AU | 759507 B2 | 4/2003 |
| AU | 2019215259 B2 | 8/2019 |

(Continued)

OTHER PUBLICATIONS

Ravi Mahajan et al.; 2016 IEEE 66th Electronic Components and Technology Conference; Embedded Multi-Die Interconnect Bridge (EMIB)—A High Density, High Bandwidth Packaging Interconnect; Authorized licensed use limited to: BAE Systems. Downloaded on Dec. 5, 2022 at 20:47:01 UTC from IEEE Xplore. Restrictions apply.

(Continued)

*Primary Examiner* — Lawrence C Tynes, Jr.
(74) *Attorney, Agent, or Firm* — Sand, Sebolt & Wernow LPA

(57)    ABSTRACT

A radio frequency (RF) bridge that may include a body having an interfacing surface and a bonding surface extending from the interfacing surface. RF bridge may also include an interconnect operably engaged with the body. The interconnect may have at least one electrical connection positioned at the interfacing surface and at least another electrical connection positioned at the interfacing surface adjacent with the at least one electrical connection. The interconnect extends curvilinearly between the at least one electrical connection and the at least another electrical connection creating a curvilinear signal path.

20 Claims, 21 Drawing Sheets

(51) Int. Cl.

| | |
|---|---|
| *H01L 23/535* | (2006.01) |
| *H01L 23/538* | (2006.01) |
| *H01L 25/065* | (2023.01) |

(52) U.S. Cl.
CPC .......... *H01L 23/5386* (2013.01); *H01L 24/16* (2013.01); *H01L 25/0655* (2013.01); *H01L 2223/6622* (2013.01); *H01L 2224/161* (2013.01); *H01L 2924/15311* (2013.01)

(58) Field of Classification Search
CPC .... H05K 2201/10098; H04L 2209/805; H04N 21/42221; H04W 12/47; H01R 2201/24; H03J 2200/12; H03J 2200/06; H03B 2200/0068; G01S 5/0252; G04R 40/04; G08B 13/2417; G01R 33/32; H01Q 3/2629; H01Q 7/005; H01Q 6/18; H01L 2223/6677; H01L 23/535; H01L 23/5381; H01L 23/5386; H01L 2223/6622; H10F 30/00
See application file for complete search history.

(56) References Cited

U.S. PATENT DOCUMENTS

| | | | |
|---|---|---|---|
| 7,649,432 | B2 | 1/2010 | Sherrer et al. |
| 7,898,356 | B2 | 3/2011 | Sherrer et al. |
| 9,974,160 | B1 | 5/2018 | Sikina et al. |
| 10,321,555 | B1 | 6/2019 | Trulli et al. |
| 10,510,669 | B2 | 12/2019 | Braunisch et al. |
| 10,693,207 | B2 | 6/2020 | Hu et al. |
| 10,720,688 | B2 | 7/2020 | Bonazzoli et al. |
| 10,741,501 | B1 * | 8/2020 | Shirley ............. H01L 21/32115 |
| 2016/0072171 | A1 | 3/2016 | Sherrer |
| 2018/0098437 | A1 | 4/2018 | Gray Haley et al. |

FOREIGN PATENT DOCUMENTS

| | | | | |
|---|---|---|---|---|
| CN | 109661725 | A * | 4/2019 | ............. H01L 24/16 |
| EP | 0901181 | A2 | 3/1999 | |
| EP | 1887659 | A1 | 2/2008 | |
| EP | 3249741 | A1 | 11/2017 | |
| GB | 2549728 | A | 11/2017 | |
| GB | 2588354 | B | 8/2021 | |
| WO | 2003019999 | A1 | 3/2003 | |
| WO | 2010091147 | A1 | 8/2010 | |
| WO | 2015066047 | A1 | 5/2015 | |
| WO | 2016179159 | A1 | 11/2016 | |
| WO | 2017105893 | A1 | 6/2017 | |
| WO | 2018034654 | A1 | 2/2018 | |
| WO | 2022132265 | A1 | 6/2022 | |

OTHER PUBLICATIONS

Gang Duan et al.; 2021 IEEE 71st Electronic Components and Technology Conference (ECTC); Die Embedding Challenges for EMIB Advanced Packaging Technology; Authorized licensed use limited to: BAE Systems. Downloaded on Dec. 5, 2022 at 20:46:12 UTC from IEEE Xplore. Restrictions apply.

* cited by examiner

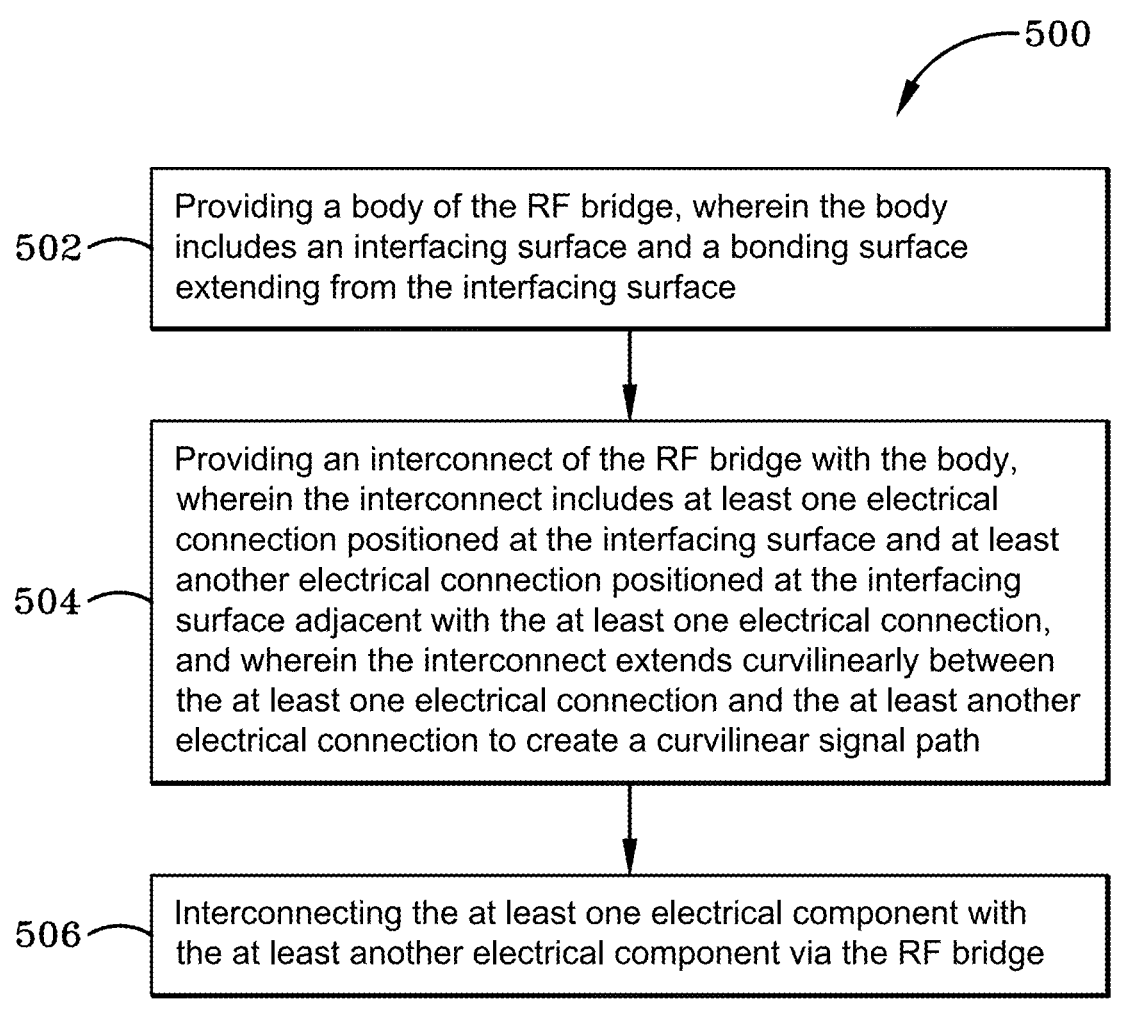

502 — Providing a body of the RF bridge, wherein the body includes an interfacing surface and a bonding surface extending from the interfacing surface 504 — Providing an interconnect of the RF bridge with the body, wherein the interconnect includes at least one electrical connection positioned at the interfacing surface and at least another electrical connection positioned at the interfacing surface adjacent with the at least one electrical connection, and wherein the interconnect extends curvilinearly between the at least one electrical connection and the at least another electrical connection to create a curvilinear signal path 506 — Interconnecting the at least one electrical component with the at least another electrical component via the RF bridge

FIG.19

RF BRIDGE

TECHNICAL FIELD

The present disclosure generally relates to interconnect structures provided in integrated circuit packages that interconnect with one another and separate integrated circuit packages.

BACKGROUND ART

Commercial integrated circuit packages or multi-chip packages generally utilize various types of integrated circuits, semiconductor dies, and other various electrical components of the like to perform various tasks and/or operations dictated by the implementation of the integrated circuit packages or multi-chip packages. In these packages, semiconductor dies and electrical components are normally unified on a substrate for ease of implementing such packages into a given product. However, such packages may include pluralities of semiconductor dies and electrical components that must be interconnected with other pluralities of semiconductor dies and electrical components found in these packages. With such connections, issue may incur largely based on performance and signal integrity due to loss and reflections caused by discontinuities and lack of proper shielding. As such, the complexity behind electrically connecting these pluralities of semiconductor dies and electrical components is rather difficult and may require ample amounts of space to provide such electrical connections.

To combat these electrical connection issues, interposers and/or interconnects may be used to interconnect at least one semiconductor die provided in a multi-chip package with at least another semiconductor die provided in the same multi-chip package. In one example, wire bonds and other conventional electrical connections of the like may be used to interconnect at least one semiconductor die provided in a multi-chip package with at least another semiconductor die in the same multi-chip package. However, such use of wire bonds and other conventional electrical connections may create electrical disturbances, including parasitic inductance. In another example, conventional embedded multi-die interconnect bridges may be used to interconnect at least one semiconductor die provided in a multi-chip package with at least another semiconductor die in the same multi-chip package. However, these bridges may create high-loss, high-impedance between semiconductor dies interconnected with one another due to the shape and/or configuration of these conventional bridges.

SUMMARY OF THE INVENTION

In one aspect, an exemplary embodiment of the present disclosure may provide a radio frequency (RF) bridge. RF bridge may include an interfacing surface of a body, a first bonding surface of a set of bonding surfaces of the body extending from the interfacing surface, a second bonding surface of the set of bonding surfaces of the body opposite to the first bonding surface and extending from the interfacing surface, and a third bonding surface of the set of bonding surfaces of the body extending between the first bonding surface and the second bonding surface. RF bridge may also include a curvilinear interconnect internally operably engaged with the body. The interconnect has at least one electrical connection positioned at the interfacing surface and proximate to the first bonding surface, and at least another electrical connection positioned at the interfacing surface and proximate to the second bonding surface adjacent with the at least one electrical connection. The interconnect extends curvilinearly between the at least one electrical connection and the at least another electrical connection inside of the body providing a curvilinear signal path.

This exemplary embodiment or another exemplary embodiment may further include that the at least one electrical connection is configured to electrically connect with a die; and the at least another electrical connection is configured to electrically connect with a cable such that the coaxial cable and the die are interconnected with one another via the interconnect. This exemplary embodiment or another exemplary embodiment may further include that the at least one electrical connection is configured to electrically connect with a first die; and the at least another electrical connection is configured to electrically connect with a second die such that the first die and the second die are interconnected with one another via the interconnect. This exemplary embodiment or another exemplary embodiment may further include that the interconnect comprises a curvilinear outer conductor extending between the at least one electrical connection and the at least another electrical connection. This exemplary embodiment or another exemplary embodiment may further include that the interconnect further comprises a curvilinear inner conductor positioned inside of the outer conductor and extending between the at least one electrical connection and the at least another electrical connection. This exemplary embodiment or another exemplary embodiment may further include that the interconnect further comprises a curvilinear dielectric defined by the outer conductor and extending between the at least one electrical connection and the at least another electrical connection. This exemplary embodiment or another exemplary embodiment may further include that the interconnect further comprises a plurality of dielectric supports operably engaged with the outer conductor and the inner conductor; wherein the plurality of dielectric supports suspends the inner conductor inside of the outer conductor. This exemplary embodiment or another exemplary embodiment may further include that the body comprises: a first aperture defined in the interfacing surface and configured to receive the at least one electrical connection; a second aperture defined in the interfacing surface and configured to receive the at least another electrical connection; and a curvilinear passageway defined in the body and extending from the first aperture to the second aperture and configured to house the interconnect inside of the body. This exemplary embodiment or another exemplary embodiment may further include a base layer of the body including a first conductive material for the interconnect; at least one intermediate layer of the body operably engaged with the base layer and including an outer conductor of the interconnect, an inner conductor of the interconnect, and a plurality of dielectric supports of the interconnect; and a second support layer of the body operably engaged with the at least one intermediate layer and including a second conductive material for the interconnect; wherein the first conductive material and the second conductive material are the same. This exemplary embodiment or another exemplary embodiment may further include that the at least one intermediate layer of the body comprises: a first intermediate layer of the body operably engages with the base layer and includes the outer conductor and a set of outer dielectric supports of the plurality of dielectric supports. This exemplary embodiment or another exemplary embodiment may further include a second intermediate layer of the body operably engages with the first intermediate layer and includes the outer conductor, the inner conductor, the set of outer dielectric supports of the plurality of dielectric supports, and a set of inner dielectric supports of the plurality of dielectric supports. This exemplary embodiment or another exemplary embodiment may further include a third intermediate layer of the body operably engages with the second intermediate layer and includes the outer conductor and the set of outer dielectric supports of the plurality of dielectric supports.

In another aspect, an exemplary embodiment of the present disclosure may provide a method of interconnecting at least one electrical component with at least another electrical component via a radio frequency (RF) bridge. The method may include steps of providing a body of the RF bridge, wherein the body includes an interfacing surface and a bonding surface extending from the interfacing surface; providing an interconnect of the RF bridge with the body, wherein the interconnect includes at least one electrical connection positioned at the interfacing surface and at least another electrical connection positioned at the interfacing surface adjacent with the at least one electrical connection, and wherein the interconnect extends curvilinearly between the at least one electrical connection and the at least another electrical connection to create a curvilinear signal path; and interconnecting the at least one electrical component with the at least another electrical component via the RF bridge.

This exemplary embodiment or another exemplary embodiment may further include that the steps of providing the body of the RF bridge and providing the interconnect with the body further comprises: providing a base layer of the RF bridge that includes a first conductive material for the interconnect; providing at least one intermediate layer of the RF bridge operably engaged with the base layer and including an outer conductor of the interconnect, an inner conductor of the interconnect, and a plurality of dielectric supports of the interconnect; and providing a top layer operably engaged with the at least one intermediate layer and including a second conductive material for the interconnect. This exemplary embodiment or another exemplary embodiment may further include that the steps of providing the body of the RF bridge and providing the interconnect with the body further comprises: providing a base layer of the RF bridge that includes a first conductive material for the interconnect; providing a first intermediate layer with the base layer and includes an outer conductor and a set of outer dielectric supports of the plurality of dielectric supports; providing a second intermediate layer with the first intermediate layer and includes the outer conductor, an inner conductor, the set of outer dielectric supports of the plurality of dielectric supports, and a set of inner dielectric supports of the plurality of dielectric supports; providing a third intermediate layer with the second intermediate layer and includes the outer conductor and the set of outer dielectric supports of the plurality of dielectric supports; and providing a top layer operably engaged with the at least one intermediate layer and including a second conductive material for the interconnect. This exemplary embodiment or another exemplary embodiment may further include steps of connecting a coaxial cable with the interconnect via the at least one electrical connection; and connecting a die with the interconnect via the at least another electrical connection; wherein the coaxial cable and the die are interconnected with one another via the interconnect. This exemplary embodiment or another exemplary embodiment may further include steps of connecting a first die, via the at least one electrical connection, with the interconnect; and connecting a second die, via the at least another electrical connection, with the interconnect; wherein the first die and the second die are interconnected with one another via the interconnect. This exemplary embodiment or another exemplary embodiment may further include steps of engaging a first set of bonding elements with the interfacing surface proximate to the at least one electrical connection; engaging a second set of bonding elements with the interfacing surface proximate to the at least another electrical connection; and engaging a third set of bonding elements with the interconnect at the at least one electrical connection and the at least another electrical connection. This exemplary embodiment or another exemplary embodiment may further include a step of engaging the bonding surface of the body with a substrate, wherein the body and the interconnect are positioned inside of a cavity defined by the substrate. This exemplary embodiment or another exemplary embodiment may further include steps of introducing a second RF bridge having a second body and a second interconnect; connecting the second interconnect of the second RF bridge with the interconnect of the RF bridge; connecting a coaxial cable with the second interconnect of the second RF bridge; and connecting a die with the interconnect of the RF bridge; wherein the coaxial cable and the die are interconnected with one another via the RF bridge and the second RF bridge.

In yet another aspect, an exemplary embodiment of the present disclosure may provide a radio frequency (RF) bridge. RF bridge may include a body having a pair of base layers and at least one intermediate layer positioned between the pair of base layers, wherein the body has a set of bonding surfaces and an interfacing surface. RF bridge may also include a first connector on the interfacing surface, a second connector on the interfacing surface; and a curvilinear interconnect electrically coupling the first connector to the second connector, wherein the curvilinear interconnect comprises one or more curvilinear passageways internal to the body providing a curvilinear signal path.

This exemplary embodiment or another exemplary embodiment may further include that the interconnect further comprises: a curvilinear outer conductor extending between the at least one electrical connection and the at least another electrical connection; a curvilinear inner conductor positioned inside of the outer conductor and extending between the at least one electrical connection and the at least another electrical connection; and a curvilinear dielectric defined by the outer conductor and extending between the at least one electrical connection and the at least another electrical connection. This exemplary embodiment or another exemplary embodiment may further include that the interconnect further comprises a plurality of dielectric supports operably engaged with the outer conductor and the inner conductor; wherein the plurality of dielectric supports suspends the inner conductor inside of the outer conductor.

BRIEF DESCRIPTION OF THE DRAWINGS

Sample embodiments of the present disclosure are set forth in the following description, are shown in the drawings and are particularly and distinctly pointed out and set forth in the appended claims.

FIG. 19 is an exemplary method flowchart.

Similar numbers refer to similar parts throughout the drawings.

DETAILED DESCRIPTION

Figure 1:
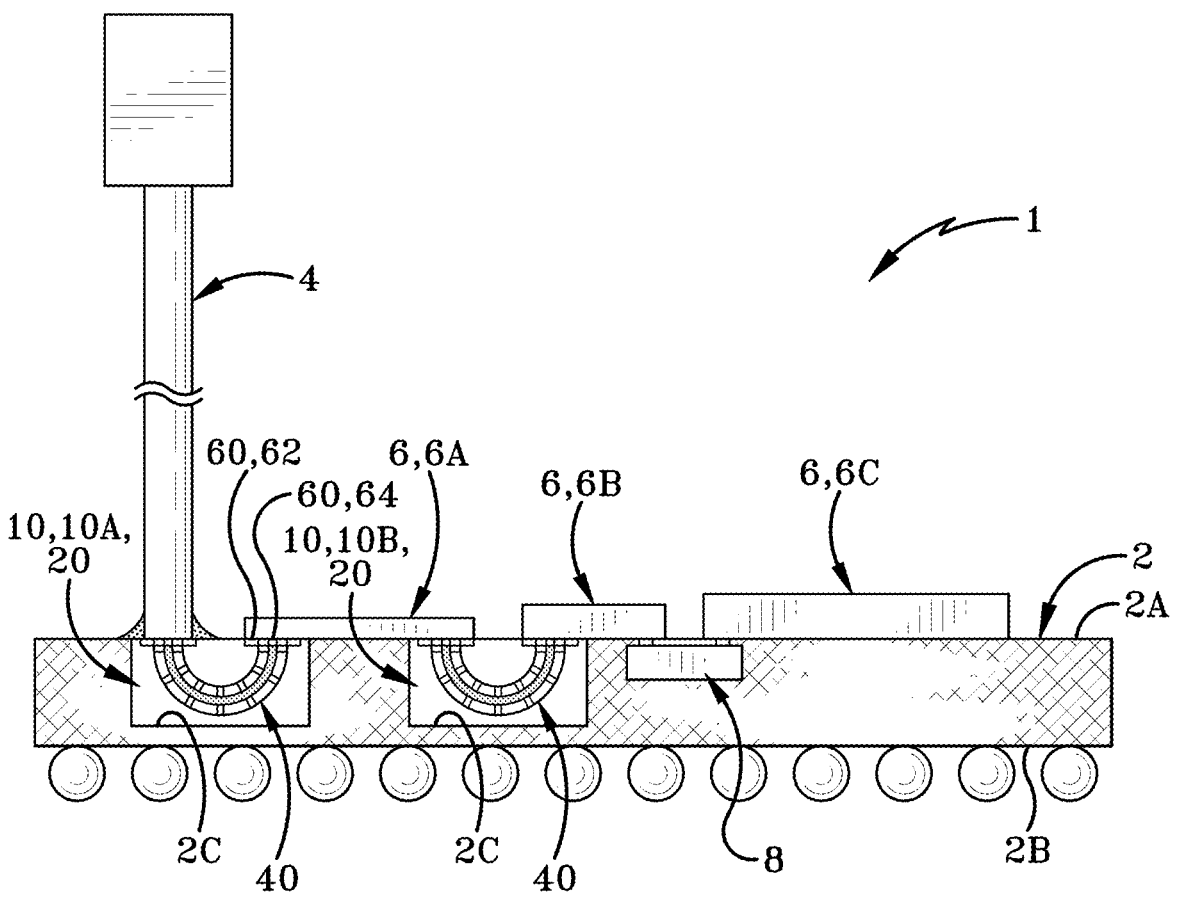
FIG. 1 is a partial sectional view of an integrated circuit (IC) package having a radio frequency (RF) bridge in accordance with one aspect of the present disclosure.

FIG. 1 illustrates an integrated circuit (IC) package generally referred to as 1. IC package 1 may include various components and/or elements dictated by the implementation of IC package 1. In the illustrated embodiment, IC package 1 may include an organic laminate or integrated circuit substrate (hereinafter "substrate") generally referred to as 2. As illustrated herein, substrate 2 may define a top or first surface 2A, a bottom or second surface 2B opposite to the first surface 2A, and a vertical axis defined therebetween. Substrate 2 may also define a plurality of cavities 2C extending into the substrate 2 from the top surface 2A towards the bottom surface 2B along an axis parallel with the vertical axis of the substrate 2. In other exemplary embodiments, substrate 2 may also define a plurality of apertures or vias extending entirely through the substrate 2 from the top surface 2A to the bottom surface 2B along an axis parallel with the vertical axis of the substrate 2.

Still referring to FIG. 1, IC package 1 may also include at least one tethered electrical conductor such as a coaxial cable 4 and at least one die 6 coupled to the surface 2A of the substrate 2. In the illustrated embodiment, IC package 1 is configured with a single coaxial cable 4, a first die 6A, a second die 6B, and a third die 6C. More particularly, IC package 1 is configured such that the coaxial cable 4 interconnects with the first die 6A, the first die 6A interconnects with the second die 6B, and the second bridge 6B interconnects with the third die 6C via electrical bridge connections; such electrical bridge connections are described in more detail below.

Still referring to FIG. 1, IC package 1 may include at least one embedded multi-die interconnect bridge (or EMIB) generally referred to as 8 which may interconnect the second die 6B and the third die 6C with one another. EMIB 8 is also embedded in substrate 2 via at least one aperture of the plurality of apertures 2C defined in the substrate 2. In this embodiment, any suitable EMIB 8 may be used to interconnect the second die 6B and the third die 6C with one another.

Still referring to FIG. 1, IC package 1 may also include at least one radio frequency ("RF") interconnect bridge, generally referred to as 10, that is configured to one of interconnect at least one coaxial cable 4 with at least one die 6 and/or to interconnect at least one die 6 with at least another die 6. In the illustrated embodiment, IC package 1 may include a first interconnect bridge 10A configured to operably engage the coaxial cable 4 with the first die 6A. IC package 1 may also include a second interconnect bridge 10B that is substantially similar to first interconnect bridge 10A and that is configured to operably engage the first die 6A with the second die 6B. As described in more detail below, interconnect bridge 10 is configured with a curvilinear-shaped interconnect to create a curvilinear signal path between at least one conductor and at least one die interconnected with one another or between at least one die and at least another die interconnected with one another. Such components and elements of interconnect bridge 10 are described in more detail below.

It should be understood herein that interconnect bridge 10 may be used to interconnect any suitable connectors and/or die provided in IC circuit package 1. While not illustrated herein, another interconnect bridge 10 may be used to interconnect the second die 6B and the third die 6C with one another instead of EMIB 8.

Figure 2:
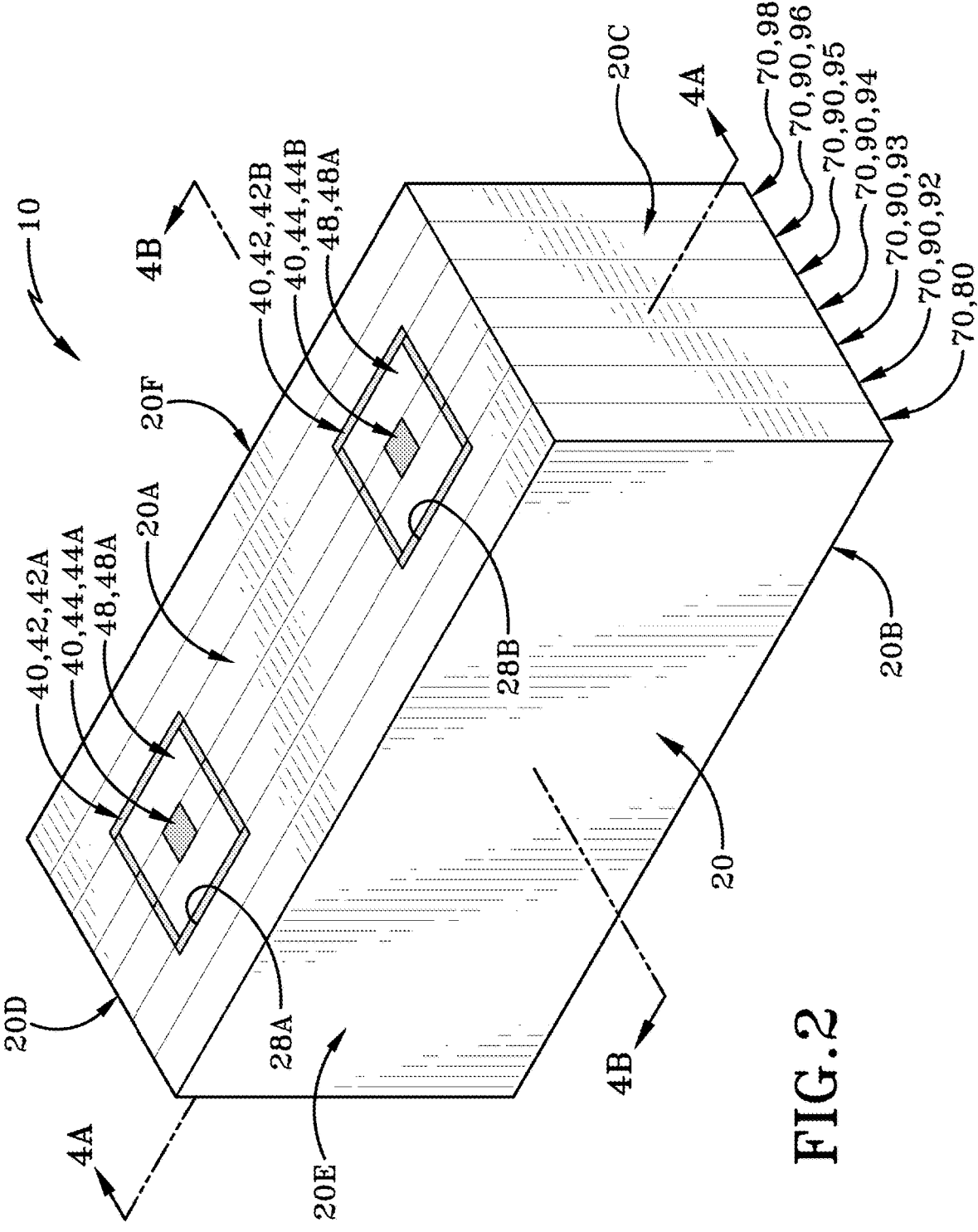
FIG. 2 is a top, front, first side isometric perspective view of the RF bridge shown in FIG. 1.

Referring to FIGS. 2 and 4, interconnect bridge 10 may include a body 20. The body 20 in this example is a rectangular body having an interfacing or interconnecting surface 20A on one side and set of bonding surfaces 20B, 20C, 20D, 20E, 20F extending on the other sides of the body 20. In the illustrated embodiment, set of bonding surfaces 20B, 20C, 20D, 20E, 20F may include a first bonding surface 20B that is parallel with the interconnecting surface 20A. Body 20 also includes a second bonding surface 20C that extends away from the interconnecting surface 20A such as orthogonally away in this example. Body 20 also includes a third bonding surface 20D that also extends away from the interconnecting surface 20A and is opposite to the second bonding surface 20C. Body 20 also includes a fourth bonding surface 20E that extends between the second bonding surface 20C and the third bonding surface 20D. Body 20 also includes a fifth bonding surface 20F that extends between the second bonding surface 20C and the third bonding surface 20D and opposite to the fourth bonding surface 20E. In one instance, the second bonding surface 20C and the third bonding surface 20D are parallel with one another and are perpendicular with the interconnecting surface 20A. In this same instance, the first bonding surface 20B is parallel with the interconnecting surface 20A and perpendicular with the second bonding surface 20C and the second bonding surface 20D.

Figure 4A:
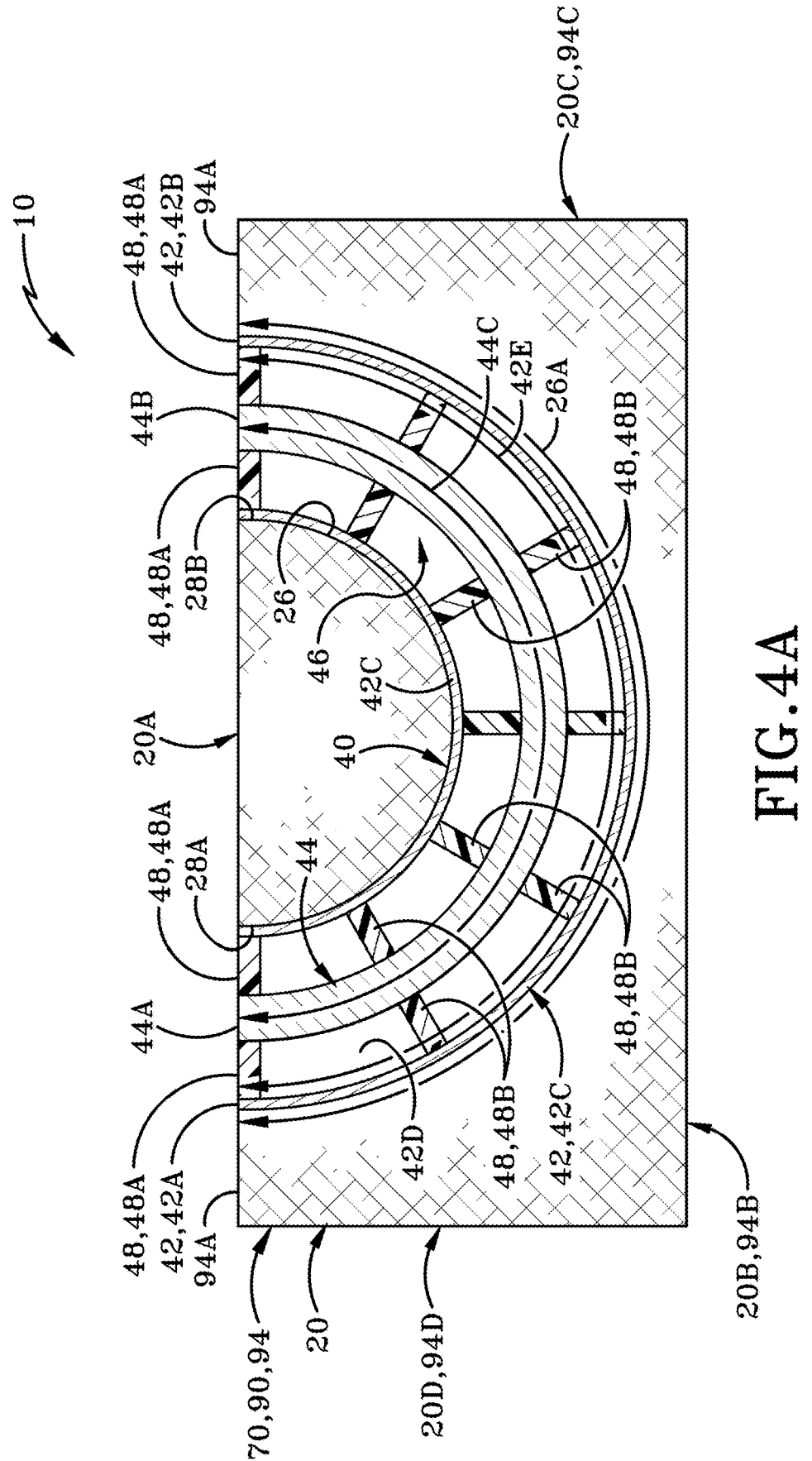
FIG. 4A is a longitudinal section view taken in the direction of lines 4A-4A as shown in FIG. 2.
Figure 4B:
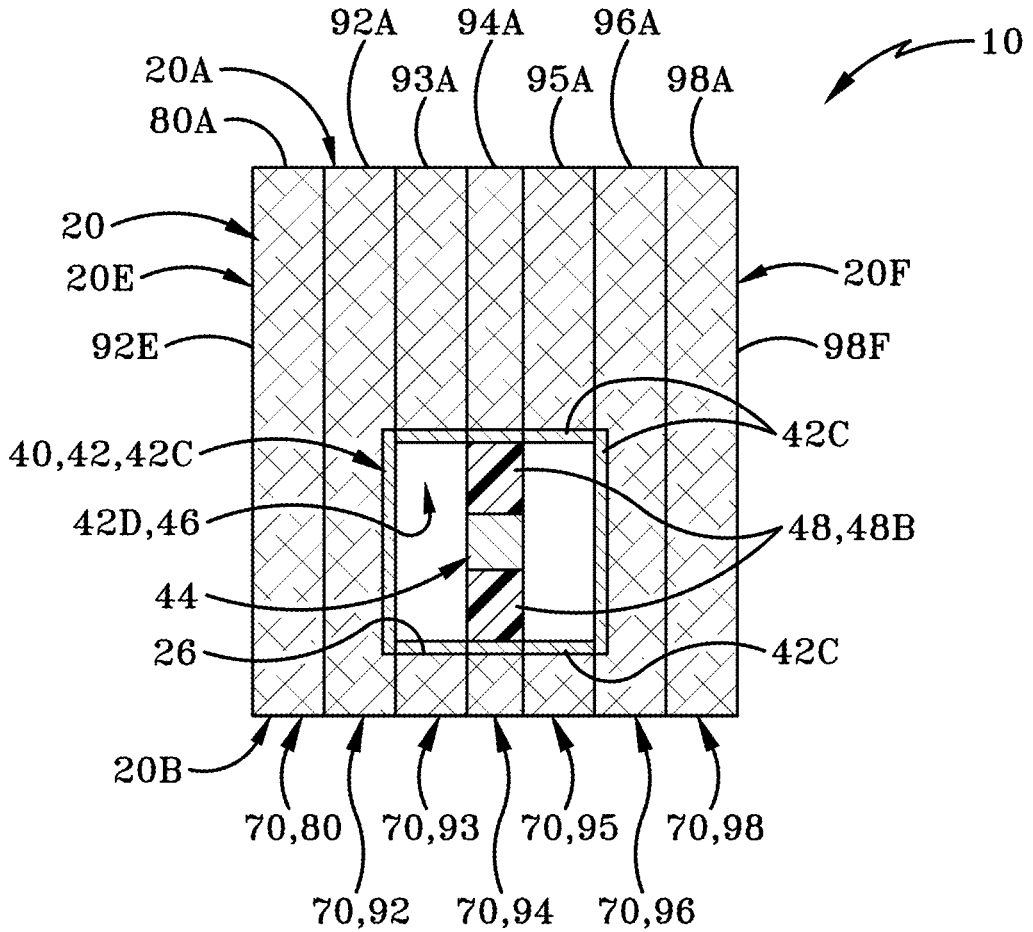
FIG. 4B is a cross-sectional view taken in the direction of lines 4B-4B as shown in FIG. 2.

Body 20 of interconnect bridge 10 may also include a passageway 26. As best seen in FIG. 4A, passageway 26 may extend continuously from a first aperture 28A defined at the interfacing surface 20A to a second aperture 28B defined at the interfacing surface 20A, wherein the passageway 26 is interiorly disposed within the body 20. In the illustrated embodiment, the passageway 26 extends curvilinearly from the first aperture 28A to the second aperture 28B. Stated differently, the body 20 includes a curvilinear-shaped and/or arcuate-shaped passageway 26 that extends between the first aperture 28A and the second aperture 28B. Such use and purpose of the curvilinear-shaped passageway 26 is described in more detail below.

According to one embodiment the body 20 is comprised of multiple layers stacked together, namely base layers 80, 98 on the outer ends of the body 20 with intermediate layers 92, 93, 94, 95, and 96 sandwiched in between.

Still referring to FIG. 4A, passageway 26 may also define a degree of curvature 26A. In the illustrated embodiment, the degree of curvature 26A of passageway 26 is between about 90 degrees up to about 180 degrees measured between the first aperture 28A and the second aperture 28B. More particularly, the degree of curvature 26A of passageway 26 is about 180 degrees measured between the first aperture 28A and the second aperture 28B. In other exemplary embodiment, a passageway of a body may define any suitable degree of curvature as dictated by the implementation of RF bridge.

The interconnect bridge 10 also includes an interconnect 40 that operably engages with the body 20. More particularly, interconnect 40 operably engages with the body 20 inside of the passageway 26, the first aperture 28A, and the second aperture 28B defined in the body 20. As described in more detail below, interconnect 40 may have at least one electrical connection positioned at the interfacing surface 20A and at least another electrical connection positioned at the interfacing surface 20A adjacent with the at least one electrical connection in which the interconnect 40 extends curvilinearly between the at least one electrical connection and the at least another electrical connection to create a curvilinear signal path. Such components and elements of interconnect 40 are described in more detail below.

Referring to FIG. 4A, interconnect 40 may include an outer conductor 42 that operably engages with the body 20. More particularly, the outer conductor 42 operably engages with the body 20 inside of one or all of the passageway 26, the first aperture 28A, and the second aperture 28B. Outer conductor 42 may include a first end or connection 42A positioned inside of the first aperture 28A, a second end or connection 42B positioned inside of the second aperture 28B and opposite to the first connection 42A, a peripheral wall 42C extending between the first connection 42A and the second connection 42B, and an interior space 42D defined inside of the peripheral wall 42C and extending between the first connection 42A and the second connection 42B. As best seen in FIG. 2, outer conductor 42 defines a substantially square cross-section that extends between the first connection 42A and the second connection 42B. In other exemplary embodiment, outer conductor 42 may define any suitable cross-sectional shape dictated by the implementation of interconnect bridge, including the cross-sectional shape of a passageway defined by a body of interconnect bridge.

As best seen in FIG. 4A, the outer conductor 42 may also define a degree of curvature 42E measured between the first connection 42A and the second connection 42B. In the illustrated embodiment, the degree of curvature 42E of outer conductor 42 is equal with the degree of curvature 26A of passageway 26 defined in body 20. In one instance, degree of curvature 42E of outer conductor 42 may be between about 90 degrees up to about 180 degrees measured between the first connection 42A and the second connection 42B. More particularly, degree of curvature 42E of outer conductor 42 is about 180 degrees measured between the first connection 42A and the second connection 42B In other exemplary embodiment, a degree of curvature of an outer conductor may define any suitable degree of curvature as dictated by the implementation of interconnect bridge, particularly to a degree of curvature defined in a body of the interconnect bridge.

Still referring to FIG. 4A, interconnect 40 may also include an inner conductor 44. The inner conductor 44 is housed and/or positioned inside of the outer conductor 44 where the inner conductor 44 is suspended inside of the outer conductor 42 and is free from contacting the outer conductor 42; such structural configuration of suspending the inner conductor 44 inside of the outer conductor 42 is described in more detail below. The inner conductor 44 includes a first end or connection 44A positioned inside of the outer connection 42 proximate to the first connection 42A, and a second end or connection 44B positioned inside of the outer connection 42 proximate to the second connection 42B and opposite to the first connection 44A. As best seen in FIG. 2, inner conductor 44 may also define a substantially square cross-section that extends between the first connection 44A and the second connection 44B. In other exemplary embodiment, inner conductor 44 may define any suitable cross-sectional shape dictated by the implementation of interconnect bridge, including the cross-sectional shape of a passageway defined by a body of interconnect bridge.

As best seen in FIG. 4A, the inner conductor 44 may also define a degree of curvature 44C measured between the first connection 44A and the second connection 44B. In the illustrated embodiment, the degree of curvature 44C of outer conductor 42 is equal with the degree of curvature 26A of passageway 26 defined in body 20 and degree of curvature 42E defined by outer conductor 42. In the illustrated embodiment, degree of curvature 44C of inner conductor 44 is from about 90 degrees up to about 180 degrees measured between the first connection 44A and the second connection 44B. Specifically, degree of curvature 44C of inner conductor 44 is about 180 degrees measured between the first connection 44A and the second connection 44B. In other exemplary embodiment, a degree of curvature of an outer conductor may define any suitable degree of curvature as dictated by the implementation of interconnect bridge, particularly to a degree of curvature defined in a body of the interconnect bridge.

Figure 3A:
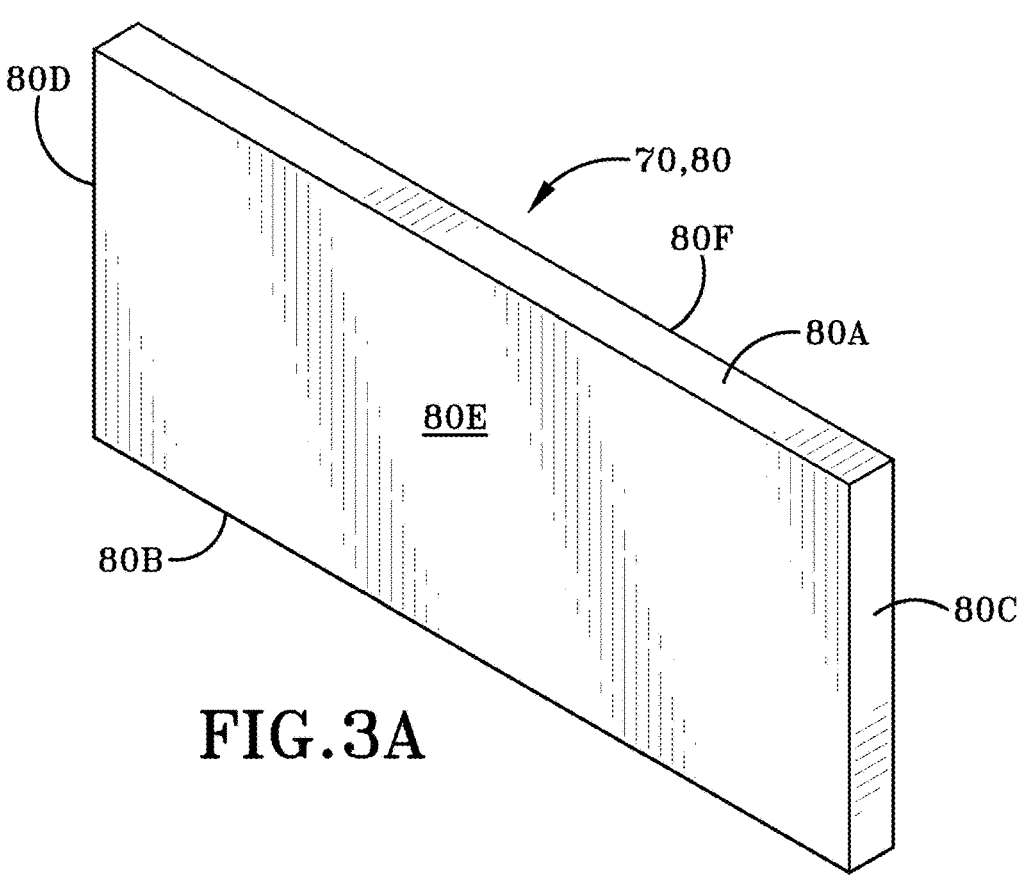
FIG. 3A is a top, front, first side isometric perspective view of a base layer of the RF bridge shown in FIG. 2.
Figure 3B:
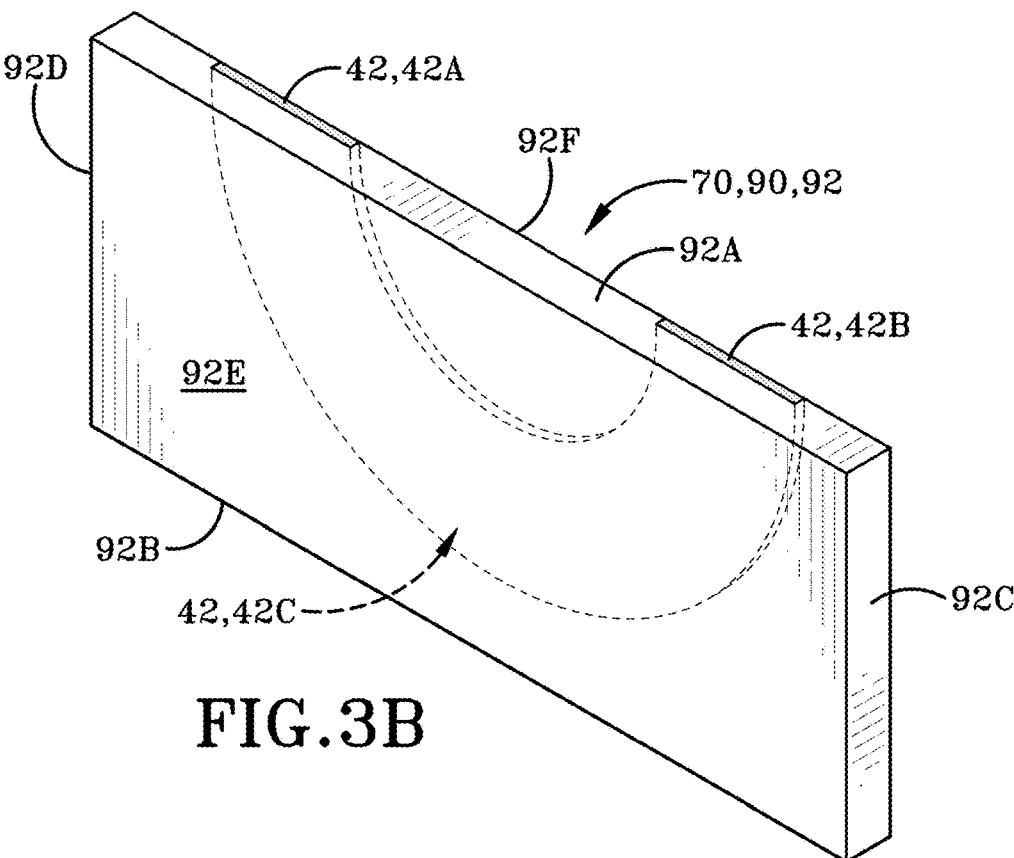
FIG. 3B is a top, front, first side isometric perspective view of a first intermediate layer of the RF bridge shown in FIG. 2.
Figures 3C, 3D:
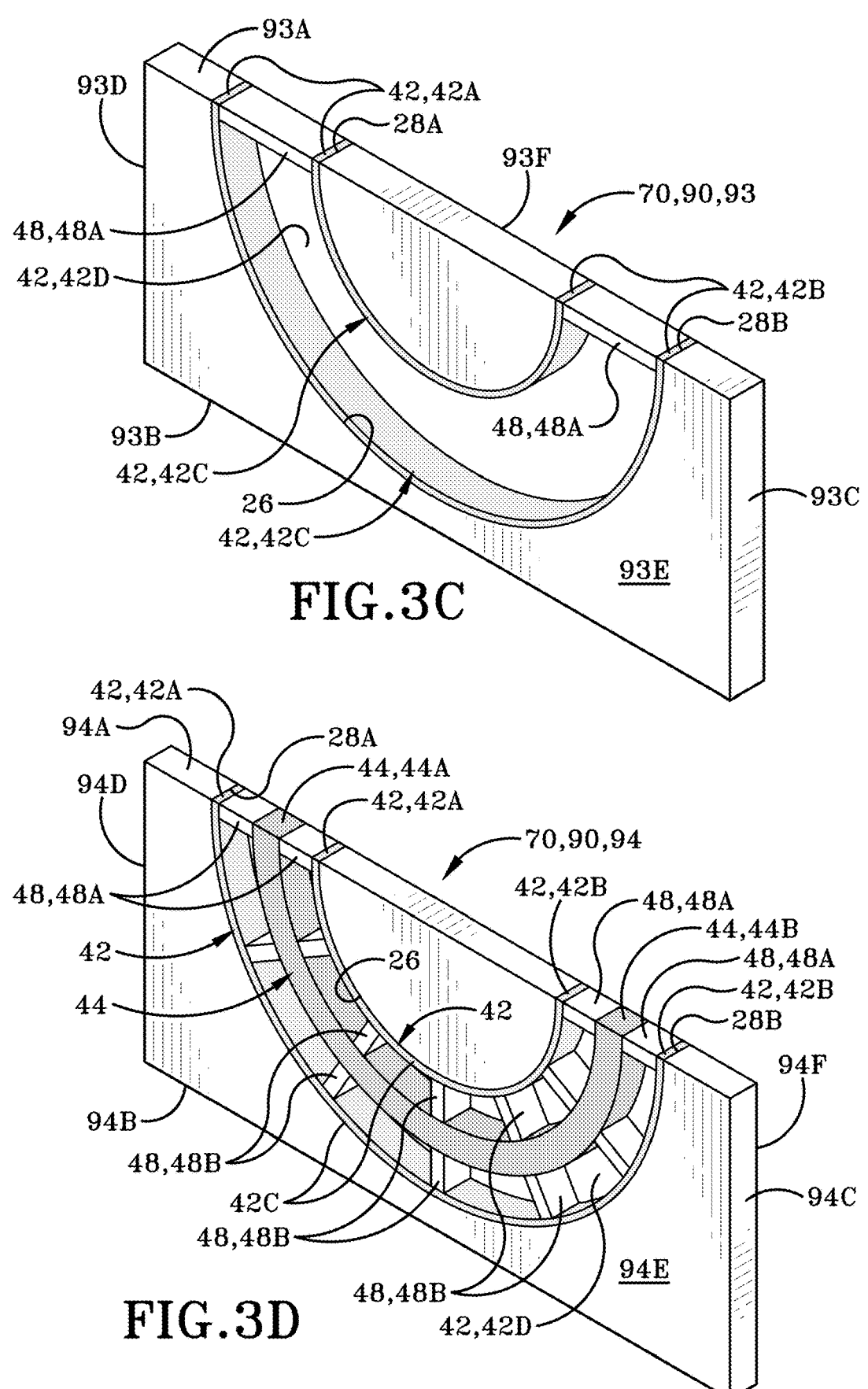
FIG. 3C is a top, front, first side isometric perspective view of a second intermediate layer of the RF bridge shown in FIG. 2.
FIG. 3D is a top, front, first side isometric perspective view of a third intermediate layer of the RF bridge shown in FIG. 2.

Interconnect bridge 10 may also include an air dielectric 48. As best seen in FIG. 3D, air dielectric 48 may be provided inside of interior space 42D of outer conductor 42 where the air dielectric 48 is operably engaged with the peripheral wall 42C inside the interior space 42D. Air dielectric 48 may also be operably engaged with the inner conductor 44 and may surround the inner conductor 44. In this illustrated embodiment, air dielectric 46 conforms to the shapes defined by the outer conductor 42 and the inner conductor 44. As such, air dielectric 46 conforms to the curvilinear-shaped outer conductor 42 and curvilinear-shaped inner conductor 44. It should be understood that air dielectric may be any suitable structure and/or member that prevents conveyance of electrical currents and/or power from traveling between the outer conductor 42 and the inner conductor 44.

Interconnect 40 may also include a plurality of dielectric supports 48 that operably engages the inner conductor 44 with the outer conductor 42. As best seen in FIG. 4A, the plurality of dielectric supports 48 may include an outer set of dielectric supports 48A that operably engages the first connection 44A and the second connection 44B of the inner conductor 44 with the first connection 42A and the second connection 42B of the outer conductor 42. Still referring to FIG. 4A, the plurality of dielectric supports 48 may also include an inner set of dielectric supports 48B that operably engages the remaining inner conductor 44 with the peripheral wall 42C of the outer conductor 42 between the first connection 42A and the second connection 42B. Such use of the plurality of dielectric supports 48 in interconnect bridge 10 is considered advantageous at least because the inner conductor 44 may be suspended inside of the outer conductor 42 and free from directly contacting the outer conductor 42. Moreover, the plurality of dielectric supports 48 prevents an electrical connection between the outer conductor 42 and the inner conductor 44 when a curvilinear signal is generated through the outer conductor 42 and the inner conductor 44.

While interconnect 40 includes the plurality of dielectric supports 48 to operably engage the inner conductor 44 with the outer conductor 42, any suitable number of dielectric supports may be used to operably engage an inner conductor with an outer conductor based on various considerations, including the shape, size, and configuration of the RF bridge. Examples of suitable numbers of dielectric supports used to operably engage an inner conductor with an outer conductor include zero, one, at least one, two, three, four, five, six, seven, and any other suitable number of dielectric supports used to operably engage an inner conductor with an outer conductor. In the illustrated embodiment, interconnect 40 includes seven dielectric supports 48 where two dielectric supports make up the outer set of dielectric supports 48A and the remaining five dielectric supports make up the inner set of dielectric supports 48B.

Figure 15:
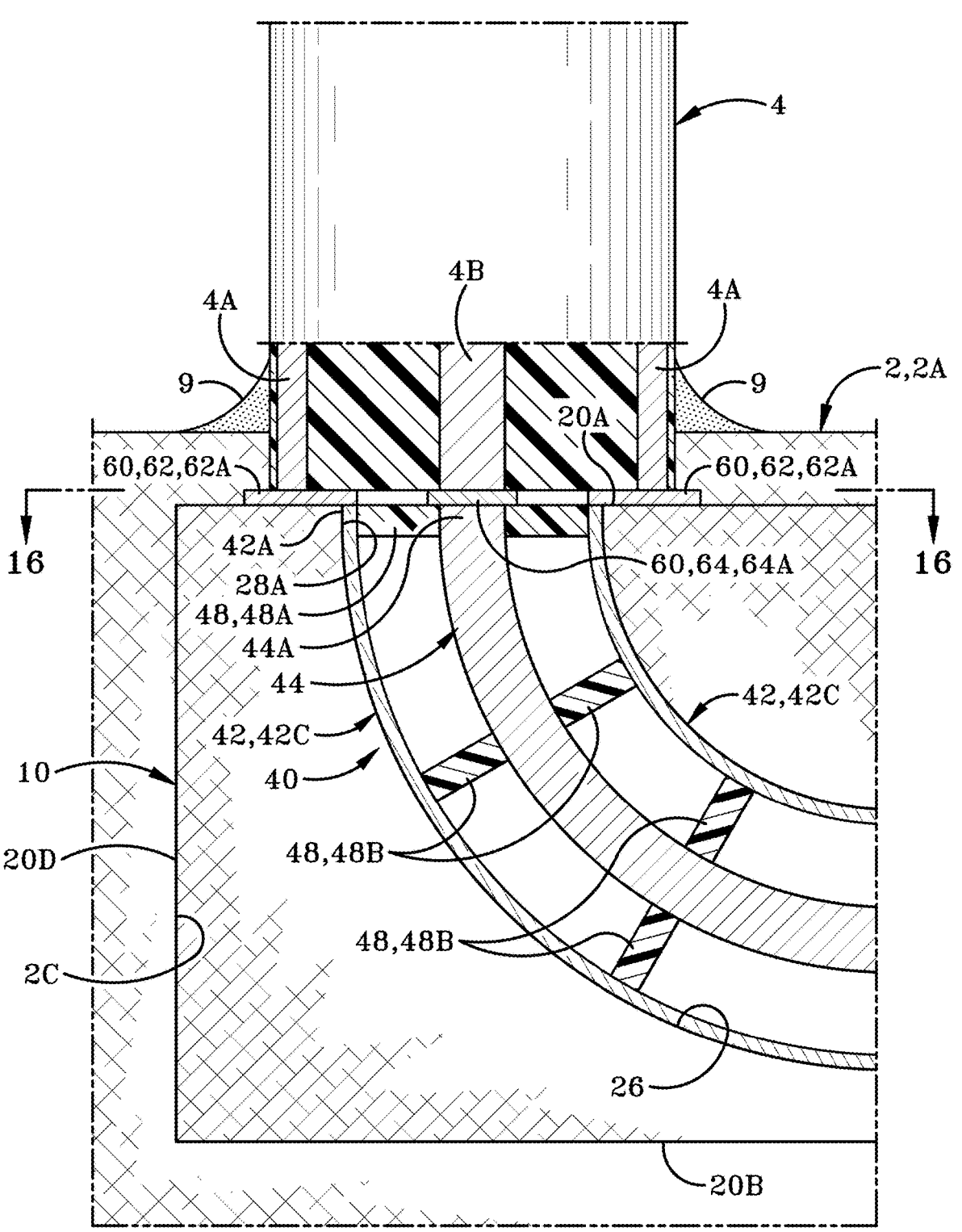
FIG. 15 is an operational view of the RF bridge (shown in FIG. 2) electrically connected with a coaxial cable.

Interconnect bridge 10 may also include at least one set bonding elements and/or bonding alloys 60. As described in more detail below, the at least one set of bonding elements 60 may electrical connect the interconnect 40 with one or more of the coaxial cable 4 and at least one die 6 for interconnections. As best seen in FIG. 15, interconnect bridge 10 described and illustrated herein may include a first set of bonding elements 62 and a second set of bonding elements 64 that operably engages with the outer conductor 42 and the inner conductor 44 for electrical connecting with the coaxial cable 4 and/or at least one die 6 for interconnections purposes.

In one instance, first set of bonding elements 62 operably engages with the outer conductor 42 and the body 20. As best seen in FIG. 15, a first bonding element 62A of the first set of bonding elements 62 operably engages with the first connection end 42A of the outer conductor 42 and the interfacing surface 20A of body 20. Similarly, as best seen in FIG. 1, a second bonding element 62B of the first set of bonding elements 62 operably engages with the second connection end 42A of the outer conductor 42 and the interfacing surface 20A of body 20. As best seen in FIGS. 1 and 15, the first set of bonding elements 62 may interconnect the coaxial cable 4 and the first die 6A with one another in a first interconnect bridge 10A, and the first set of bonding elements 62 may interconnect the first die 6A and the die 6B with one another in a second interconnect bridge 10B; the first interconnect bridge 10A and the second interconnect bridge 10B are substantially similar to one another.

In this same instance, second set of bonding elements 64 operably engages with the inner conductor 44. As best seen in FIG. 15, a first bonding element 64A of the second set of bonding elements 64 operably engages with the first connection end 44A of the inner conductor 44. Similarly, as best seen in FIG. 1, a second bonding element 64B of the second set of bonding elements 64 operably engages with the second connection end 44A of the inner conductor 44. As best seen in FIGS. 1 and 15, the second set of bonding elements 64 may interconnect the coaxial cable 4 and the first die 6A with one another in a first interconnect bridge 10A, and the second set of bonding elements 64 may interconnect the first die 6A and the die 6B with one another in a second interconnect bridge 10B; it should be understood that the first interconnect bridge 10A and the second interconnect bridge 10B are substantially similar to one another in this implementation of IC package 1.

It should be understood that the first set of bonding elements 62 and the second set of bonding element 64 of interconnect bridge 10 may define any suitable size, shape, and configuration dictated by the implementation of the interconnect bridge 10 described and illustrated herein. In one instance, each bonding element 62A, 62B of first set of bonding elements 62 may define a first sectional shape, and each bonding element 64A, 64B of second set of bonding elements 64 may define a second sectional shape that is substantially similar to first sectional shape. In this same instance, each bonding element 62A, 62B of first set of bonding elements 62 may define a substantially planar and/or rectangular section shape, and each bonding element 64A, 64B of second set of bonding elements 64 may define a substantially planar and/or rectangular section shape (see FIG. 15). In another instance, each bonding element 62A, 62B of first set of bonding elements 62 may define a first sectional shape, and each bonding element 64A, 64B of second set of bonding elements 64 may define a second sectional shape that is different than first cross-sectional shape. In this same instance, each bonding element 62A, 62B of first set of bonding elements 62 may define a substantially L-shaped section shape, and each bonding element 64A, 64B of second set of bonding elements 64 may define a substantially planar and/or rectangular section shape (see FIG. 17).

Figure 18:
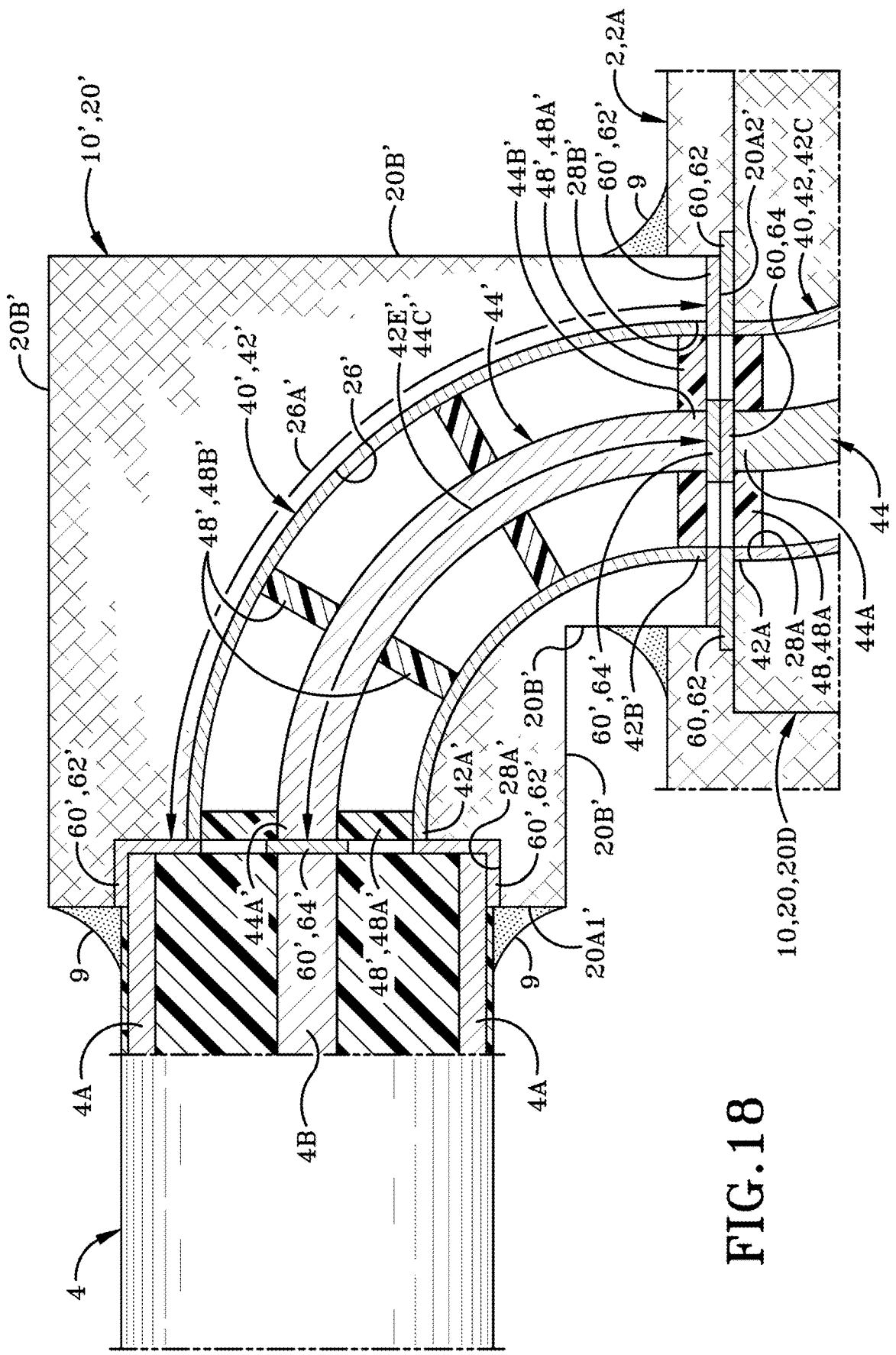
FIG. 18 is another operational view similar to FIG. 15, but the coaxial cable and the RF bridge are interconnected via an alternative RF bridge in accordance with one aspect of the present disclosure.

FIG. 18 illustrates another interconnect bridge 10' that is configured to operably engage one of a coaxial cable 4 or at least one die 6 with interconnect bridge 10. Interconnect bridge 10' is similar to interconnect bridge 10 described above and illustrated in FIGS. 1-4B, except as detailed below.

Referring to FIG. 18, interconnect bridge 10' includes a L-shaped body 20' that has at least one interfacing surface 20A' and at least one set of bonding surfaces 20B, 20C, 20D, 20E, 20F'. In the illustrated embodiment, interconnect bridge 10' includes a first interfacing surface 20A1' and a second interfacing surface 20B' that is positioned orthogonal to the first interfacing surface 20A1'. Moreover, body 20' includes a plurality of bonding surfaces 24' that extends between the first interfacing surface 20A1' and the second interfacing surface 20B'. Body 20' also defines a curvilinear-shaped passageway 26', a first aperture 28A', and a second aperture 28B' similar to curvilinear-shaped passageway 26, first aperture 28A, and second aperture 28B of body 20. Passageway 26' also defines a degree of curvature 26A' where the degree of curvature 26A' of passageway 26' is less than degree of curvature 26A of passageway 26 defined by body 20. In the illustrated embodiment, the degree of curvature 26A' of passageway 26' is about 90 degrees measured between the first aperture 28A' and the second aperture 28B'.

Still referring to FIG. 18, interconnect bridge 10' also includes an interconnect 40' that is similar to interconnect 40 of interconnect bridge 10 previously discussed above. More particularly, interconnect 40' includes an outer conductor 42', an inner conductor 44', an air dielectric 46', and a plurality of dielectric supports 48' that are similar to outer conductor 42, inner conductor 44, air dielectric 46, and a plurality of dielectric supports 48 of interconnect 40.

In this embodiment, however, the outer conductor 42' of interconnect 40' of interconnect bridge 10' may also define a degree of curvature 42E' measured between a first connection 42A' and a second connection 42B'. In the illustrated embodiment, the degree of curvature 42E' of outer conductor 42' is equal with the degree of curvature 26A' of passageway 26' defined in body 20' and less than degree of curvature 42E of outer conductor 42 discussed above. As such, degree of curvature 42E' of outer conductor 42' is about 90 degrees measured between the first connection 42A' and the second connection 42B'.

In this same embodiment, the inner conductor 44' may also define a degree of curvature 44C' measured between a first connection 44A' and a second connection 44B'. In the illustrated embodiment, the degree of curvature 44C' of inner conductor 44' is equal with the degree of curvature 26A' of passageway 26' defined in body 20' and degree of curvature 42E' defined by outer conductor 42' yet less than the degree of curvature 44C of inner conductor 44 discussed above. As such, degree of curvature 44C' of inner conductor 44' is about 90 degrees measured between the first connection 44A' and the second connection 44B'.

Such use of interconnect bridge 10' is considered advantageous at least because interconnect bridge 10' enables a designer of IC package 1 to electrically connect coaxial cable 4 with interconnect bridge 10 such that the coaxial cable 4 is oriented orthogonally to the substrate 2 and oriented parallel to the interconnect bridge 10. More particularly, coaxial cable 4 is oriented parallel with the top surface 2A of substrate 2 and oriented parallel to interfacing surface 20A of body 20 of interconnect bridge 10 via use of interconnect bridge 10'. A designer may desire to utilize interconnect bridge 10' in an IC package 1 due to lack of overhead and/or vertical space above substrate 2 and interconnect bridge 10.

Having now described the components and elements of interconnect bridge 10, a method of manufacturing at least one RF bridge is described in more detail below.

Interconnecting bridge 10 may be formed from a set of plating layers 70. More particularly, interconnect bridge 10 may be formed by at least one base layer 80, at least one intermediate layer 90, and at least one top layer 98 (best seen in FIG. 2) in the set of plating layers. In this illustrated embodiment, the at least one intermediate layer 90 may include the interfacing surface 20A, the body 24, the passageway 26, the first aperture 28A, and the second aperture 28B of the body 20 as well as components and parts that form the interconnect 40. As such, the base layer 80 and the top layer 98 may be configured to encapsulate the at least one intermediate layer 90 to provide protection to the interconnect 40 from the exterior environment surrounding the body 20. It should be understood that any suitable number of layers may be used to form the body 20 and the interconnect of the interconnect bridge 10. In the illustrated embodiment, interconnect bridge 10 includes the base layer 80, a plurality of intermediate layers 90 including the interfacing surface 20A, the body 24, the passageway 26, the first aperture 28A, and the second aperture 28B of the body 20 as well as components and parts that form the interconnect 40, and the top layer 98. Such features and elements of the base layer 80, each intermediate layer of the plurality of intermediate layers 90, and the top layer 98 are described in more detail below.

Initially, interconnect bridge 10 includes the base layer 80 that is formed on a support surface or structure to begin the formation of interconnect bridge 10. As best seen in FIG. 3A, base layer 80 may include a first end 80A, a second end 80B opposite to the first end 80A, a third end 80C extending between the first end 80A and the second end 80B, and a fourth end 80D extending between the first end 80A and the second end 80B and opposite to the third end 80C. Base layer 80 also defines a first surface 80E that is positioned above the first end 80A, the second end 80B, the third end 80C, and the fourth end 80D. Base layer 80 also defines a second surface 80F that is positioned below the first end 80A, the second end 80B, the third end 80C, and the fourth end 80D and is opposite to the first surface 80E. In the illustrated embodiment, the base layer 80 is a solid member and is free from any electrical components that form the interconnect 40.

Interconnect bridge 10 may also include a first intermediate layer 92 of the plurality of intermediate layers 90 that is formed with the base layer 80 at the first surface 80A. As best seen in FIG. 3B, first intermediate layer 92 may include a first end 92A, a second end 92B opposite to the first end 92A, a third end 92C extending between the first end 92A and the second end 92B, and a fourth end 92D extending between the first end 92A and the second end 92B and opposite to the third end 92C. First intermediate layer 92 also defines a first surface 92E that is positioned above the first end 92A, the second end 92B, the third end 92C, and the fourth end 92D. First intermediate layer 92 also defines a second surface 92F that is positioned below the first end 92A, the second end 92B, the third end 92C, and the fourth end 92D and is opposite to the first surface 92E. In the illustrated embodiment, first intermediate layer 92 may define a first plating material along the second surface 92F.

As best seen in FIG. 3B, first plating material is formed on the second surface 92F in a curvilinear shape to match the curvilinear shape of the passageway 26 and the interconnect 40 formed in later intermediate layers, which are described in more detail below. First intermediate surface 92 may also begin to form the outer set of dialectic supports 48A of the plurality of dielectric supports 48.

Interconnect bridge 10 may also include a second intermediate layer 93 of the plurality of intermediate layers 90 that is formed after the first intermediate layer 92. Upon formation of interconnect bridge 10, the second intermediate layer 92 is formed to the second surface 92F of first intermediate layer 92. As best seen in FIG. 3C, second intermediate layer 93 may include a first end 93A, a second end 93B opposite to the first end 93A, a third end 93C extending between the first end 93A and the second end 93B, and a fourth end 93D extending between the first end 93A and the second end 93B and opposite to the third end 93C. Second intermediate layer 93 also defines a first surface 93E that is positioned above the first end 93A, the second end 93B, the third end 93C, and the fourth end 93D. Second intermediate layer 93 also defines a second surface 93F that is positioned below the first end 93A, the second end 93B, the third end 93C, and the fourth end 93D and is opposite to the first surface 93E.

In the illustrated embodiment, second intermediate layer 93 may begin to form the passageway 26, the first aperture 28A, and the second aperture 28B of the body 20 along with the outer conductor 42 of interconnect 40. As best seen in FIG. 3C, a portion of the first surface 93E is omitted to define the passageway 26, and a portion of the first end 93A is omitted to define the first aperture 28A and the second aperture 28B. A portion of outer conductor 42 of interconnect 40 also begins to form inside of the passageway 26. Second intermediate layer 93 may also continue to form the outer set of dialectic supports 48A once started in first intermediate layer 92.

Interconnect bridge 10 may also include a third intermediate layer 94 of the plurality of intermediate layers 90 that is formed after the second intermediate layer 93. Upon formation of interconnect bridge 10, the third intermediate layer 94 is formed to the second surface 93F of second intermediate layer 93. As best seen in FIG. 3D, third intermediate layer 94 may include a first end 94A, a second end 94B opposite to the first end 94A, a third end 94C extending between the first end 94A and the second end 94B, and a fourth end 94D extending between the first end 94A and the second end 94B and opposite to the third end 94C. Third intermediate layer 94 also defines a first surface 94E that is positioned above the first end 94A, the second end 94B, the third end 94C, and the fourth end 94D. Third intermediate layer 94 also defines a second surface 94F that is positioned below the first end 94A, the second end 94B, the third end 94C, and the fourth end 94D and is opposite to the first surface 94E.

In the illustrated embodiment, third intermediate layer 94 may continue to form the passageway 26, the first aperture 28A, and the second aperture 28B of the body 20 along with the outer conductor 42, the inner conductor 44, the air dielectric 46, and the plurality of dielectric supports 48 of interconnect 40. As best seen in FIG. 3C, a portion of the first surface 94E is omitted to define the passageway 26, and a portion of the first end 93A is omitted to define the first aperture 28A and the second aperture 28B. In this illustrated layer, the inner conductor 44, air dielectric 46, and the plurality of dielectric supports 48 (particularly the inner set of dielectric supports 48B) may be fully formed in the third intermediate layer 94 while the outer conductor 42 of interconnect 40 continues to be formed inside of the passageway 26. Third intermediate layer 94 may also continue to form the outer set of dialectic supports 48A.

Figure 3E:
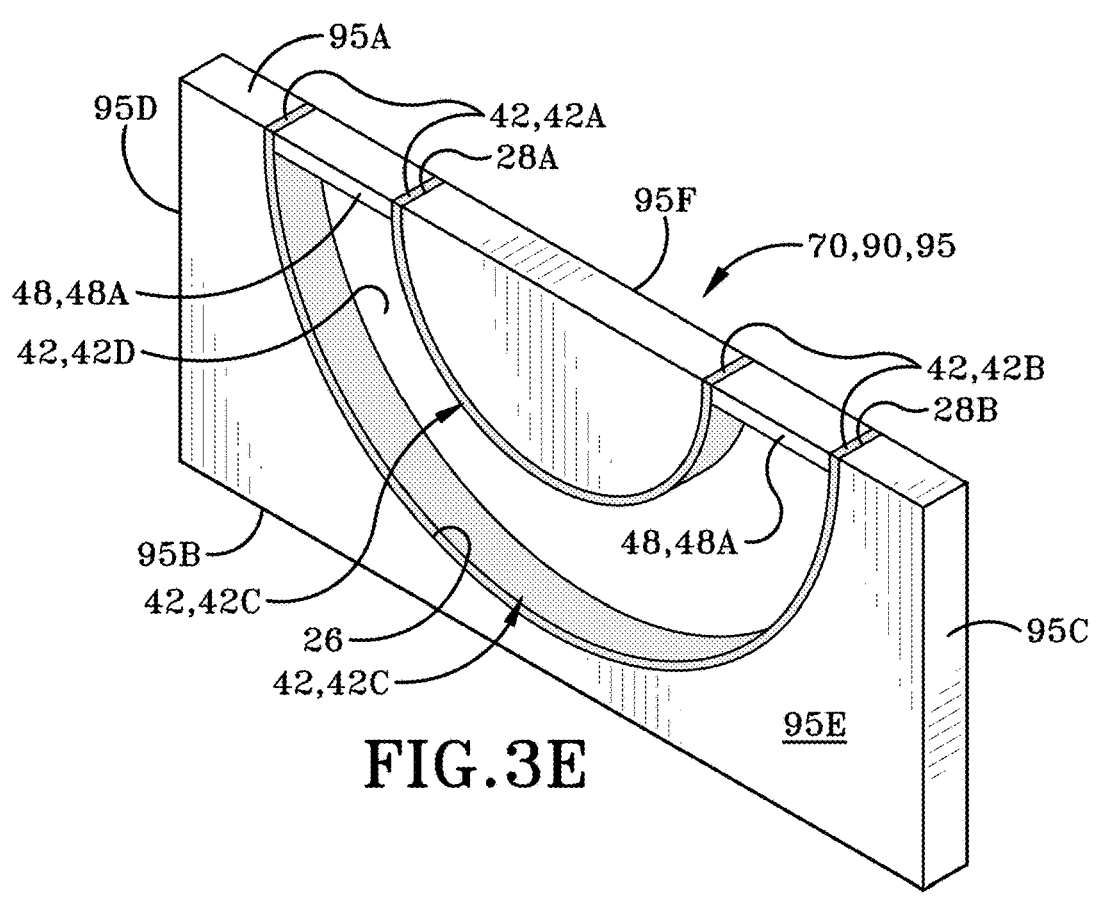
FIG. 3E is a top, front, first side isometric perspective view of a fourth intermediate layer of the RF bridge shown in FIG. 2.

Interconnect bridge 10 may also include a fourth intermediate layer 95 of the plurality of intermediate layers 90 that is formed after the third intermediate layer 93. Upon formation of interconnect bridge 10, the fourth intermediate layer 95 is formed to the second surface 94F of third intermediate layer 94. As best seen in FIG. 3E, fourth intermediate layer 95 may include a first end 95A, a second end 95B opposite to the first end 95A, a third end 95C extending between the first end 95A and the second end 95B, and a fourth end 95D extending between the first end 95A and the second end 95B and opposite to the third end 95C. Fourth intermediate layer 95 also defines a first surface 95E that is positioned above the first end 95A, the second end 95B, the third end 95C, and the fourth end 95D. Fourth intermediate layer 95 also defines a second surface 95F that is positioned below the first end 95A, the second end 95B, the third end 95C, and the fourth end 95D and is opposite to the first surface 95E.

In the illustrated embodiment, fourth intermediate layer 95 may continue to form the passageway 26, the first aperture 28A, and the second aperture 28B of the body 20 along with the outer conductor 42 of interconnect 40. As best seen in FIG. 3E, a portion of the first surface 95E is omitted to define the passageway 26, and a portion of the first end 93A is omitted to define the first aperture 28A and the second aperture 28B. The outer conductor 42 of interconnect 40 finalizes formation inside of the passageway 26 of fourth intermediate layer 95. Fourth intermediate layer 95 may also continue to form the outer set of dialectic supports 48A continued from the third intermediate layer 94.

Figure 3F:
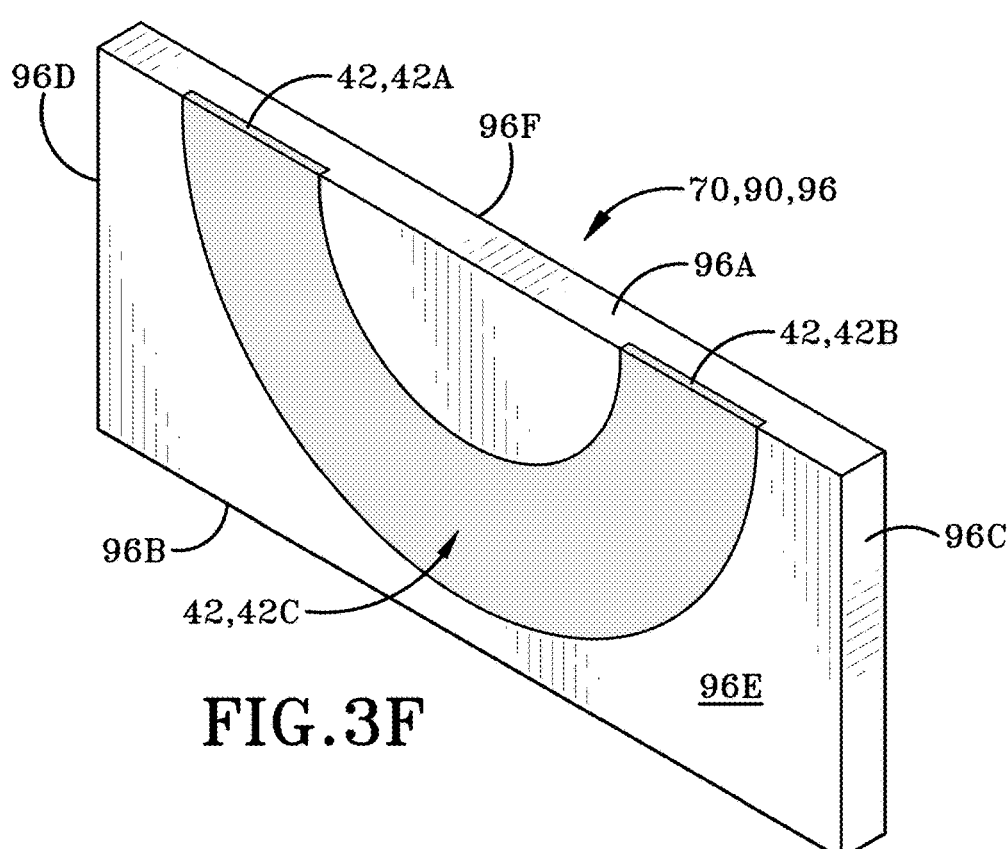
FIG. 3F is a top, front, first side isometric perspective view of a fifth intermediate layer of the RF bridge shown in FIG. 2.

Interconnect bridge 10 may also include a fifth intermediate layer 96 of the plurality of intermediate layers 90 that is formed after the fourth intermediate layer 95. Upon formation of interconnect bridge 10, the fifth intermediate layer 96 is formed to the second surface 95F of fourth intermediate layer 95. As best seen in FIG. 3F, fifth intermediate layer 96 may include a first end 96A, a second end 96B opposite to the first end 96A, a third end 96C extending between the first end 96A and the second end 96B, and a fourth end 96D extending between the first end 96A and the second end 96B and opposite to the third end 96C. Fifth intermediate layer 96 also defines a first surface 96E that is positioned above the first end 96A, the second end 96B, the third end 96C, and the fourth end 96D. Fifth intermediate layer 96 also defines a second surface 96F that is positioned below the first end 96A, the second end 96B, the third end 96C, and the fourth end 96D and is opposite to the first surface 96E. In the illustrated embodiment, fifth intermediate layer 96 may define a second plating material along the first surface 96E. As best seen in FIG. 3F, second plating material is formed on the first surface 96E in a curvilinear shape to match the curvilinear shape of the passageway 26 and the interconnect 40. The formation of the outer set of dialectic supports 48A may also be ceased at the fifth intermediate layer 96, which ultimately ceases the formation of the interconnect 40.

Figure 3G:
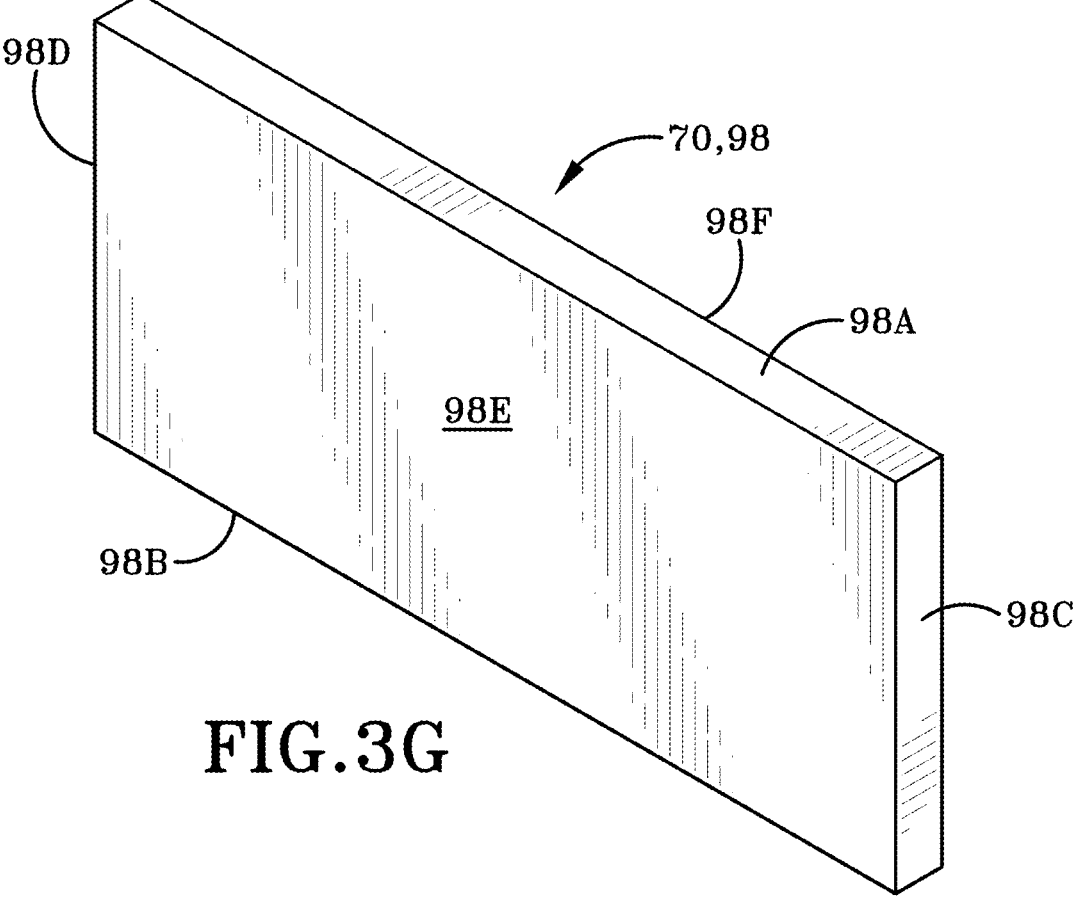
FIG. 3G is a top, front, first side isometric perspective view of a top layer of the RF bridge shown in FIG. 2.

Lastly, interconnect bridge 10 includes the top layer 98 that is formed on the fifth intermediate layer 96 and to complete the formation of interconnect bridge 10. Upon formation of interconnect bridge 10, the top layer 98 is formed to the second surface 96F of fifth intermediate layer 96. As best seen in FIG. 3G, top layer 98 may include a first end 98A, a second end 98B opposite to the first end 98A, a third end 98C extending between the first end 98A and the second end 98B, and a fourth end 98D extending between the first end 98A and the second end 98B and opposite to the third end 98C. Top layer 98 also defines a first surface 98E that is positioned above the first end 98A, the second end 98B, the third end 98C, and the fourth end 98D. Top layer 98 also defines a second surface 98F that is positioned below the first end 98A, the second end 98B, the third end 98C, and the fourth end 98D and is opposite to the first surface 98E. In the illustrated embodiment, the top layer 98 is a solid member and is free from any electrical components that form the interconnect 40.

While interconnect bridge 10 is formed with the base layer 80, the plurality of intermediate layers 90, and top layer 98, an interconnect bridge described and illustrated herein may be formed by any suitable number of layers. In one instance, a base layer and a top layer may be omitted from an exemplary interconnect bridge in which a plurality of intermediate layers only forms the interconnect bridge. In this same instance, a first intermediate layer would be the initial and/or base layer for the RF bridge, and a fifth intermediate layer would be the final and/or top layer for the RF bridge. In another instance, a base layer and a top layer may be omitted from an exemplary interconnect bridge in which a plurality of intermediate layers only forms the RF bridge. In this same instance, a first intermediate layer would be the initial and/or base layer for the RF bridge, and a third intermediate layer would be the final and/or top layer for the RF bridge. As such, intermediate layers that forms an interconnect would be confined to a single intermediate layer formed between the base layer and the top layer in this exemplary interconnect bridge. In yet another instance, RF bridge may be a single, monolithic component that is free from having multiple layers to form the interconnect bridge.

FIGS. 5-7B illustrate another manufacturing instance with interconnect bridge 110 that is similar to interconnect bridge 10 described above, except as detail below. As illustrated herein, interconnect bridge 110 includes a body 120 with an interfacing surface 120A, a first bonding surface 120B, a second bonding surface 120C, a third bonding surface 120D, a fourth bonding surface 120E, and a fifth bonding surface 120F that are substantially similar to interfacing surface 20A and the set of bonding surfaces 20B, 20C, 20D, 20E, 20F with first bonding surface 20B, a second bonding surface 20C, a third bonding surface 20D, a fourth bonding surface 20E, and a fifth bonding surface 20F of body 20. As also illustrated herein, interconnect bridge 110 also includes an interconnect 140 that includes an outer conductor 142 having first and second connections 142A, 142B and a peripheral wall 142C substantially similar to outer conductor 42 with first and second connections 42A, 42B and peripheral wall 42C. As also illustrated herein, interconnect bridge 110 also includes the interconnect 140 that has an inner conductor 144 having first and second connections 144A, 144B substantially similar to inner conductor 44 with first and second connections 44A, 44B. As also illustrated herein, interconnect bridge 110 also include outer and inner sets of dielectric supports 148A, 148B of a plurality of dielectric supports 148 substantially similar to outer and inner sets of dielectric supports 48A, 48B of the plurality of dielectric supports 48.

Interconnect bridge 110 may be formed by at least one base layer 180, at least one intermediate layer 190, and at least one top layer 198 (best seen in FIG. 5) substantially similar to base layer 80, at least one intermediate layer 90, and at least one top layer 98 of interconnect bridge 10. As such, the at least one intermediate layer 190 may also include the interfacing surface 120A, the set of bonding surfaces, 120B, 120C, 120D, 120E, 120F, the passageway 126, the first aperture 128A, and the second aperture 128B of the body 120 as well as components and parts that form the interconnect 140. More particularly, first intermediate layer 192, second intermediate layer 193, third intermediate layer 194, fourth intermediate layer 195, and fifth intermediate layer 196 may also include the interfacing surface 120A, the set of bonding surfaces, 120B, 120C, 120D, 120E, 120F, the passageway 126, the first aperture 128A, and the second aperture 128B of the body 120 as well as components and parts that form the interconnect 140. As such, the base layer 180 and the top layer 198 may be configured to encapsulate the at least one intermediate layer 190 to provide protection to the interconnect 140 from the exterior environment surrounding the body 120. It should be understood that any suitable number of layers may be used to form the body 120 and the interconnect of the interconnect bridge 110. In the illustrated embodiment, interconnect bridge 110 includes the base layer 180, a plurality of intermediate layers 190 including the interfacing surface 120A, the body 24, the passageway 126, the first aperture 128A, and the second aperture 128B of the body 120 as well as components and parts that form the interconnect 140, and the top layer 198. Such features and elements of the base layer 180, each intermediate layer of the plurality of intermediate layers 190, and the top layer 198 are described in more detail below.

Figure 5:
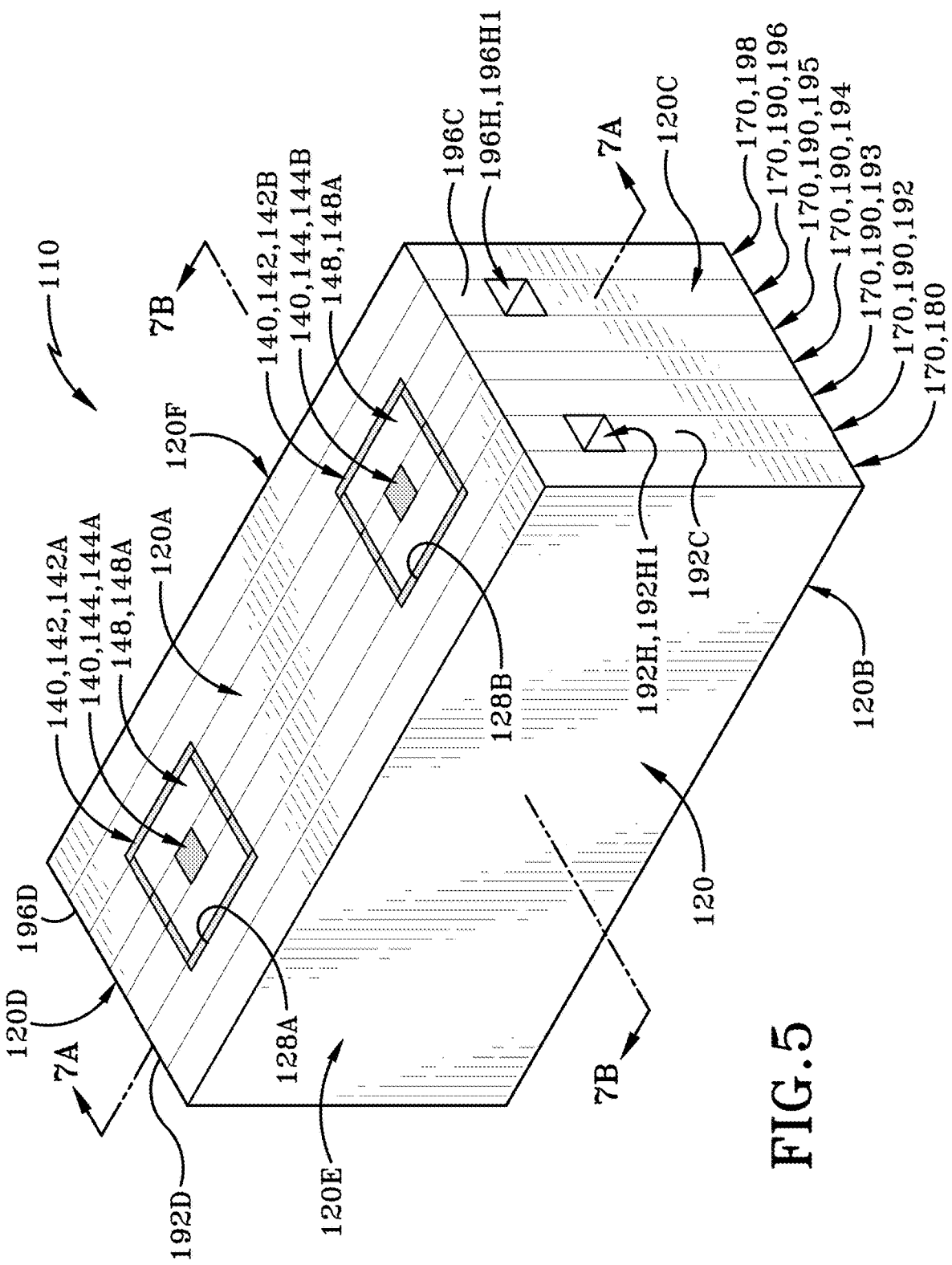
FIG. 5 is a top, front, first side isometric perspective view another RF bridge in accordance with another aspect of the present disclosure.
Figures 6, 7A, 7B:
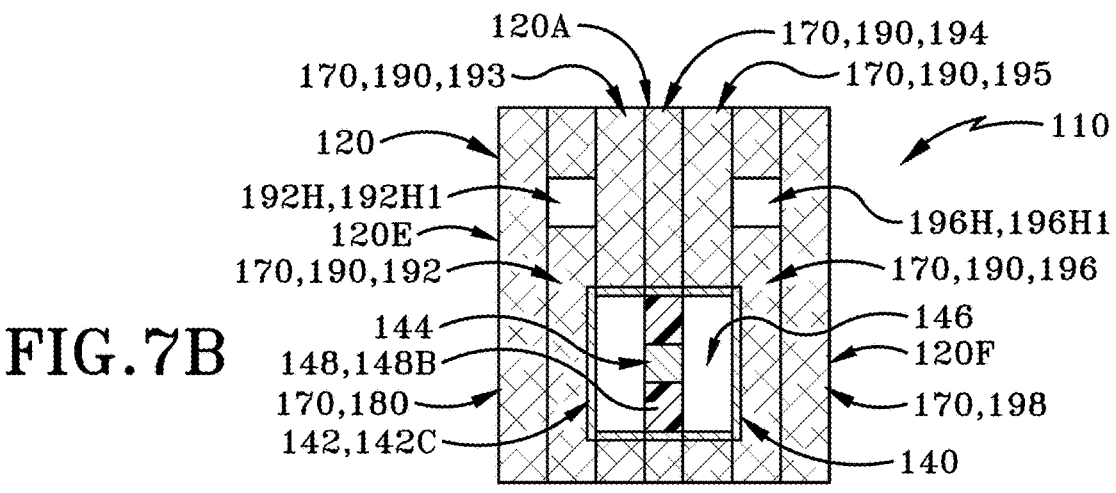
FIG. 6 is a rear elevation view of RF bridge shown in FIG. 5.
FIG. 7A is a longitudinal section view taken in the direction of lines 7A-7A as shown in FIG. 5.
FIG. 7B is a cross-sectional view taken in the direction of lines 7B-7B as shown in FIG. 5.

In illustrated interconnect bridge 110, first intermediate layer 192 may define at least one weep passage 192H that extends entirely through the first intermediate layer 192. As best seen in FIGS. 5-7B, first intermediate layer 192 may define a first weep passage 192H1, a second weep passage 192H2, and a third weep passage 92H3. As best seen in FIGS. 5 and 7A-7B, the first weep passage 192H1 may extend longitudinally through the first intermediate layer 192 between third end 193C and fourth end 193D of the first intermediate layer 192. As best seen in FIG. 7A, the second weep passage 192H2 may extend transversely through the first intermediate layer 192 from second end 193B towards first end 193A and terminates at the first weep passage 192H1; as such, the first weep passage 192H1 and the second weep passage 192H2 are in fluid communication with one another. As best seen in FIG. 7A, the third weep passage 192H3 may also extend transversely through the first intermediate layer 192 from the second end 193B towards the first end 193A and terminates at the first weep passage 192H1; as such, the first weep passage 192H1 and the third weep passage 192H3 are in fluid communication with one another.

The inclusion of weep passages 192H1, 192H2, 192H3 is considered advantageous at least because the weep passages 192H1, 192H2, 192H3 provides access to the outer conductor 142 partially formed in the first intermediate layer 192. Such access to the outer conductor 142 via weep passages 192H1, 192H2, 192H3 enables ease of removing temporary dielectric (not illustrated) formed between the outer conductor 142 and the inner conductor 144 during formation of interconnect bridge 110. It should be noted that the temporary dielectric used to support the outer conductor 142 and the inner conductor 144 inside of the first intermediate layer 192 (along with remaining intermediate layers) during formation of interconnect bridge is removed from FIGS. 5-7B.

In illustrated interconnect bridge 110, fifth intermediate layer 196 of the interconnect bridge 110 may also define at least one weep passage 196H that extends entirely through the fifth intermediate layer 196 similar to first intermediate layer 192 described above. As best seen in FIGS. 5-6 and 7B, fifth intermediate layer 196 may define a first weep passage 196H1, a second weep passage 196H2, and a third weep passage 196H3. As best seen in FIGS. 5 and 7B, the first weep passage 196H1 may extend longitudinally through the fifth intermediate layer 196 between third end 196C and fourth end 196D of the fifth intermediate layer 196 substantially similar to the first weep passage 192H1. The second weep passage 196H2 may extend transversely through the fifth intermediate layer 196 from second end 196B towards first end 196A and terminates at the first weep passage 196H1 substantially similar to the second weep passage 192H2; as such, the first weep passage 196H1 and the second weep passage 196H2 are in fluid communication with one another. The third weep passage 196H3 may also extend transversely through the fifth intermediate layer 196 from the second end 196B towards the first end 196A and terminates at the first weep passage 196H1; as such, the first weep passage 196H1 and the third weep passage 196H3 are in fluid communication with one another.

The inclusion of weep passages 196H1, 196H2, 196H3 is considered advantageous at least because the weep passages 196H1, 196H2, 196H3 provides access to the outer conductor 142 partially formed in the fifth intermediate layer 196. Such access to the outer conductor 142 via weep passages 192H1, 192H2, 192H3 enables ease of removing temporary dielectric (not illustrated) formed between the outer conductor 142 and the inner conductor 144 during formation of interconnect bridge 110. It should be noted that the temporary dielectric used to support the outer conductor 412 and the inner conductor 144 during formation of interconnect bridge is removed from FIGS. 5-7B.

Figure 8:
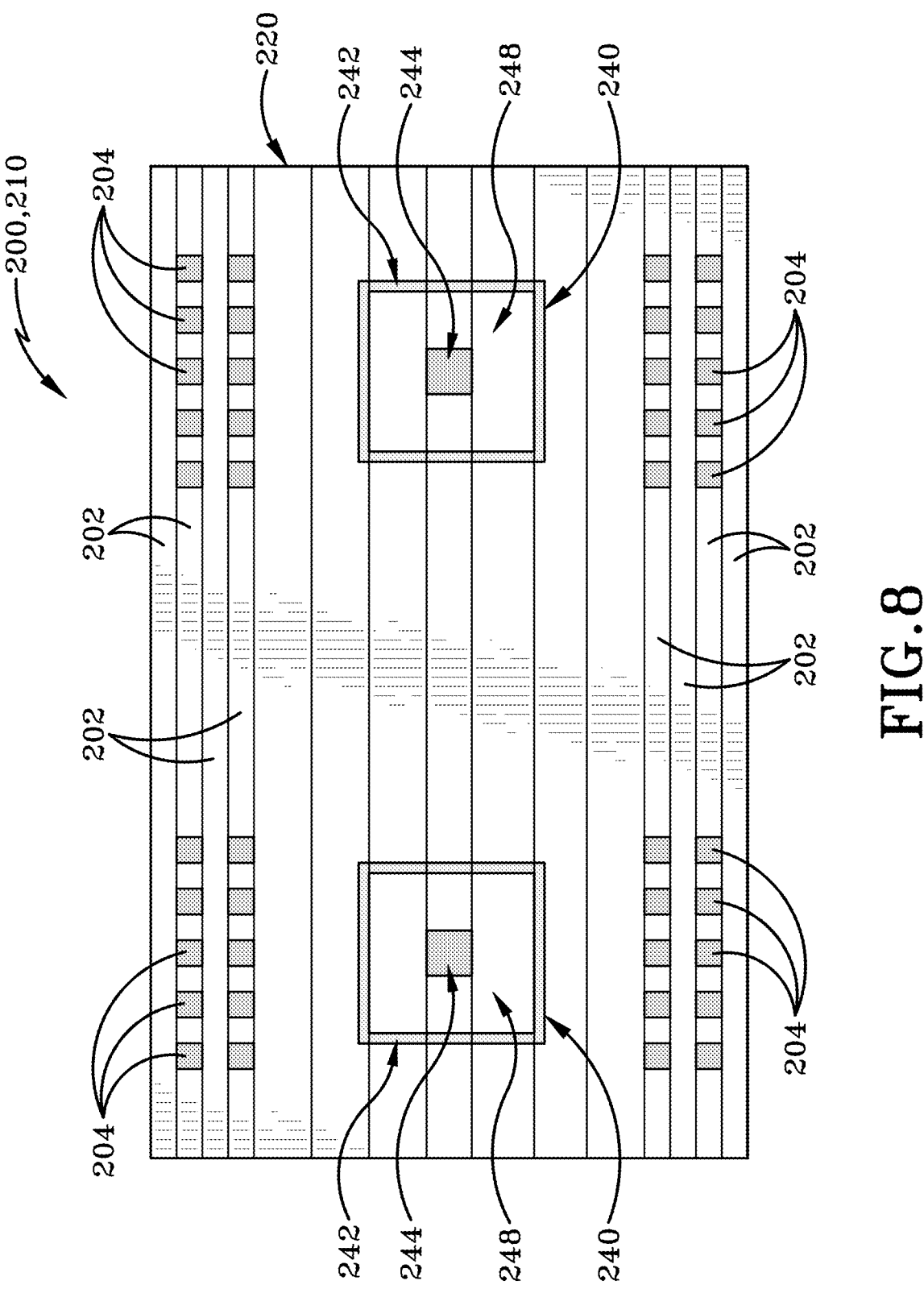
FIG. 8 is a top plan view of another RF bridge in accordance with another aspect of the present disclosure, wherein the RF bridge is operably engaged with a digital die package.
Figure 9:
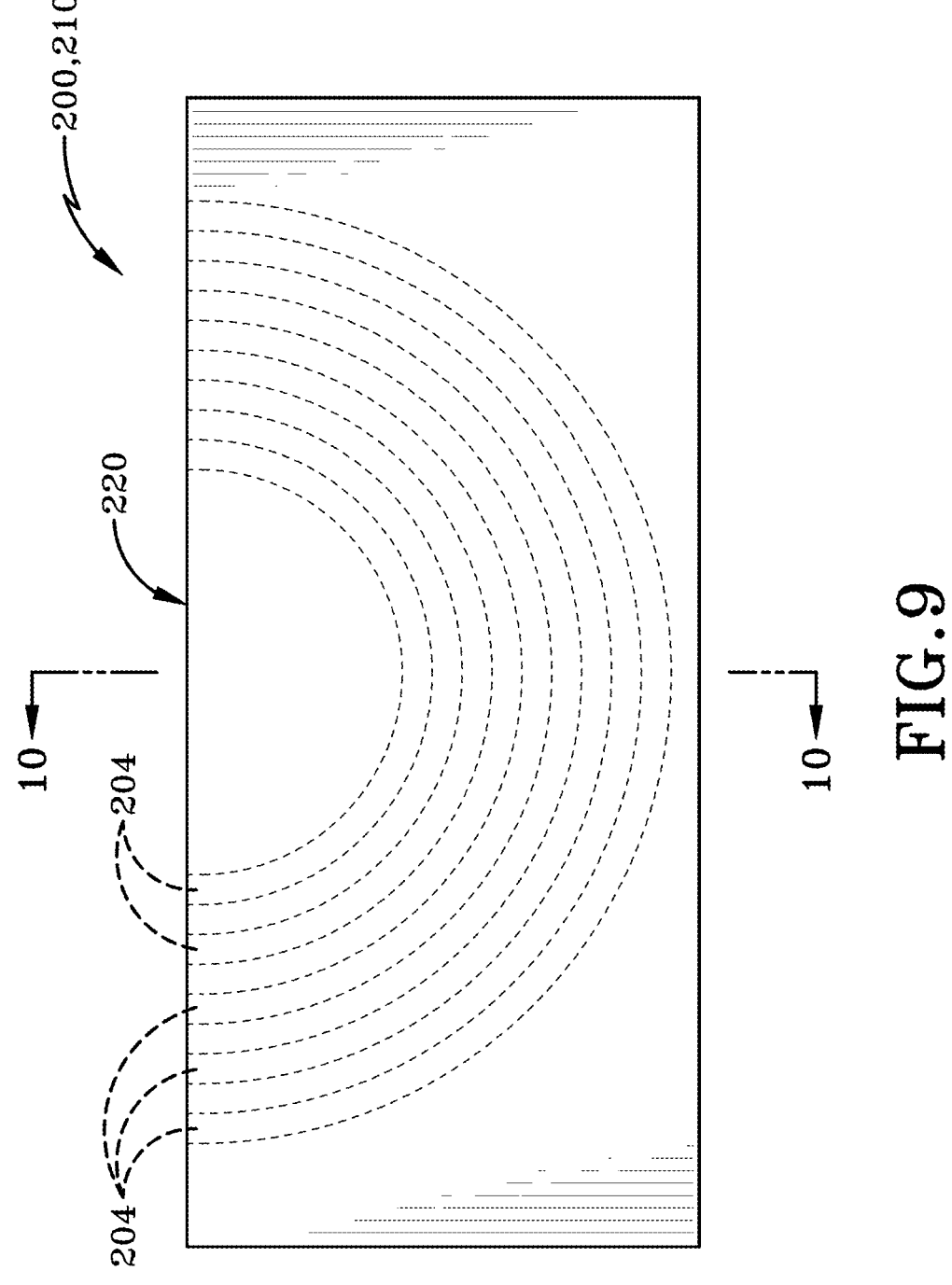
FIG. 9 is a side elevation view of RF bridge shown in FIG. 8.
Figure 10:
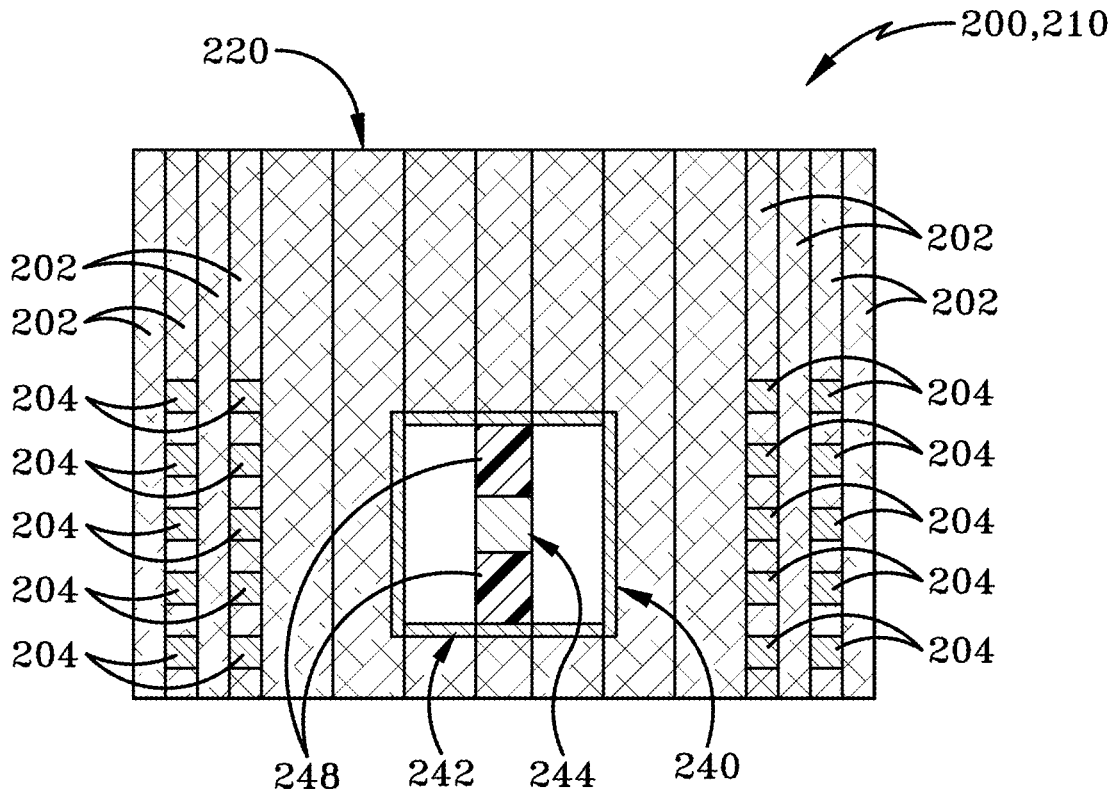
FIG. 10 is a cross-sectional view taken in the direction of lines 10-10 as shown in FIG. 9.

In another manufacturing instance, an interconnect bridge 210 (substantially similar to interconnect bridge 10) may also be paired with and/or operably engaged with a digital die package 200 that includes dielectric supports 202 defining a set of digital signal lines 204. As best seen in FIGS. 8-10, interconnect bridge 210 may be embedded and/or operably engaged inside of the digital die package 200. Such inclusion inside of the interconnect bridge 210 inside of digital die package 200 enables the interconnect bridge 210 to interconnect at least two dies with one another for digital signaling processes and to be close in proximity with one another. As such, the at least two dies may be electrically connected with the digital signal lines 204 of the digital die package 200 as well as being electrically interconnected with one another via the interconnect bridge 210. The inclusion of interconnect bridge 210 may also enable a designer of the digital die package 200 to omit the use of digital specific bridges or laminate routing conventionally used in the art for interconnecting at least two dies with one another. The inclusion of the interconnect bridge 210 may also enable a designer to form the interconnect bridge 210 as a wire bond component to interconnect at least two dies with one another, as such, the designer may eliminate or omit the use of a direct wire bone between the at least two dies.

In another manufacturing instance, at least two interconnect bridges may be operably engaged with one another in any suitable configuration relative to one another dictated by the implementation of the at least two interconnect bridges. Such suitable configurations of operably engaging at least two interconnect bridges with one another are described in more detail below.

In one example, a temporary carrier 300 may be used to temporary support a first interconnect bridge 310A (substantially similar to interconnect bridge 10) and a interconnect RF bridge 310B (substantially similar to interconnect bridge 10) when bonding the first and second interconnect bridges

Figures 11, 12:
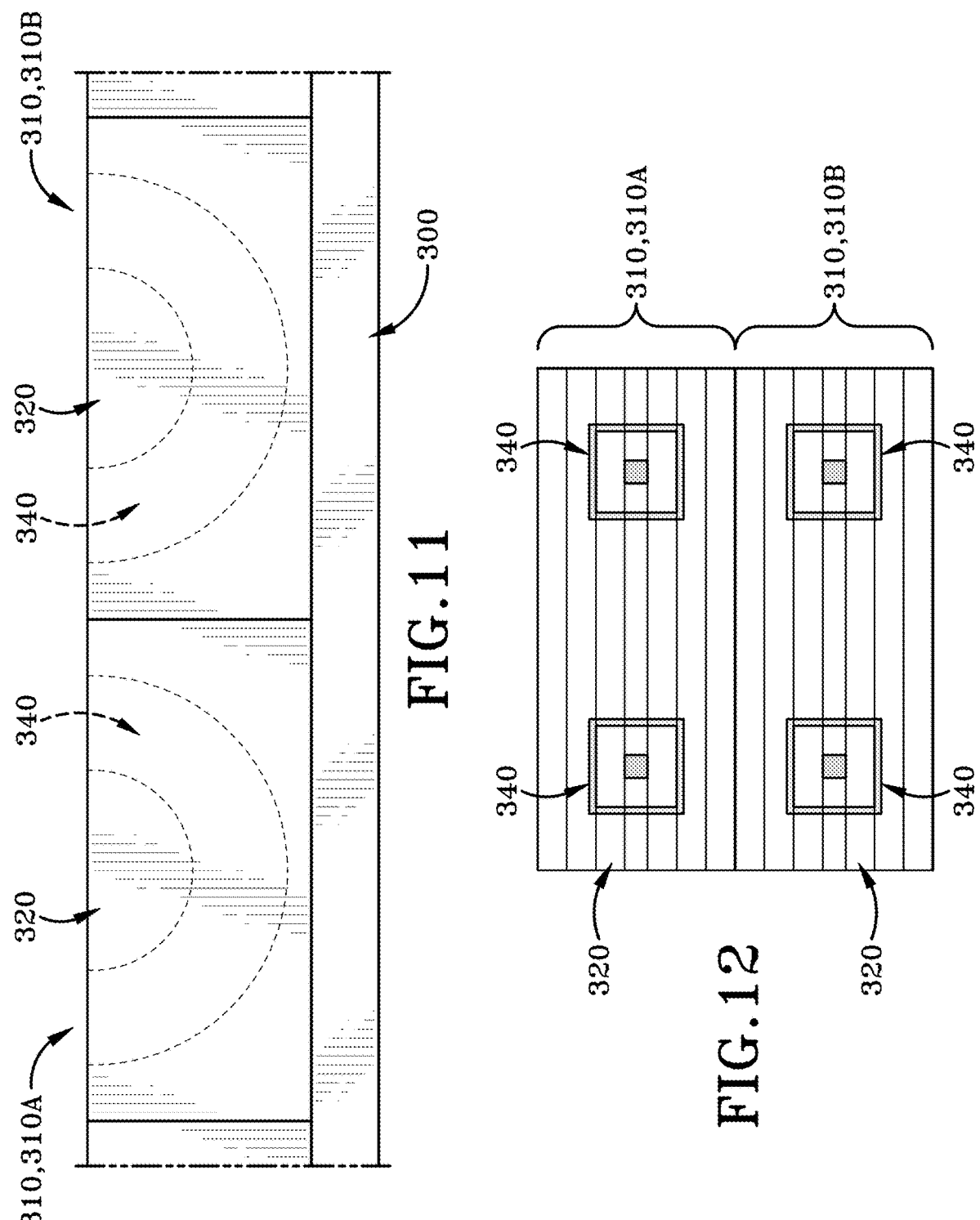
FIG. 11 is a side elevation view of two RF bridges operably engaged with one another in a first configuration in accordance with one aspect of the present disclosure.
FIG. 12 is a top plan view of two RF bridges operably engaged with one another in a second configuration in accordance with one aspect of the present disclosure.

310A, 3108 with one another (as best seen in FIG. 11). In this example, first and second interconnect bridges 310A, 3108 are longitudinal adjacent to one another relative to the temporary carrier 300A in which the first and second interconnect bridges 310A, 310B are arranged in an end-to-end configuration. In this same example, interfacing surfaces 322 of first and second interconnect bridges 310A, 3108 are parallel and are coaxial with one another, and the interconnects 340 of first and second interconnect bridges 310A, 3108 are longitudinal adjacent to one another. The temporary carrier 300 in this example may be removed from interconnect bridges 310A, 310B once interconnect bridges 310A, 310B are bonded with one another.

In another example, temporary carrier 300 may be used to temporary support a first interconnect bridge 310A (substantially similar to interconnect bridge 10) and a interconnect RF bridge 310B (substantially similar to interconnect bridge 10) when bonding the first and second interconnect bridges 310A, 3108 with one another (as best seen in FIG. 12). In this example, first and second interconnect bridges 310A, 310B are vertically adjacent to one another relative to the temporary carrier 300A in which the first and second interconnect bridges 310A, 3108 are arranged in a side-to-side configuration. In this same example, interfacing surfaces 322 of first and second interconnect bridges 310A, 310B are parallel and are coaxial with one another, and the interconnects 340 of first and second interconnect bridges 310A, 310B are vertically adjacent to one another where the interconnect 340 of the first RF bridge 310A is vertically above the interconnect 340 of the second RF bridge 310B. The temporary carrier 300 in this example may be removed from interconnect bridges 310A, 310B once interconnect bridges 310A, 310B are bonded with one another.

Having now described the various methods of manufacturing interconnect bridges, methods of electrically connecting the interconnect bridge 10 (and other interconnect bridges described herein) with suitable electrical components of an IC package are described in more detail below.

Prior to methods of electrically connecting the interconnect bridge 10 with suitable electrical components of an IC package, interconnect bridge 10 may be embedded with and/or operably engaged with substrate 2 prior to electrically connecting the interconnect bridge 10 with electrical components of the IC package 1. As best seen in FIGS. 1, 13, 15-18, interconnect bridge 10 is introduced into the substrate 2, via one of the apertures 2C defined in the substrate 2, at either the top surface 2A of substrate 2 or the bottom surface 2B of substrate 2. Once the interconnect bridge 10 is engaged inside of the substrate 2, a bonding material (e.g., an epoxy, resin, or similar bonding material of the like) may be used to operably engage the interconnect bridge 10 inside of the substrate to maintain the interconnect bridge 10 inside of the substrate 2. It should be understood that process of introducing and engaging an RF bridge with a substrate previously described may be repeated based on the number of RF bridges that may be installed with substrate. Once embedded, interconnect bridge 10 may then be used to electrically connect electrical components and elements with the interconnect bridge 10.

Figure 13:
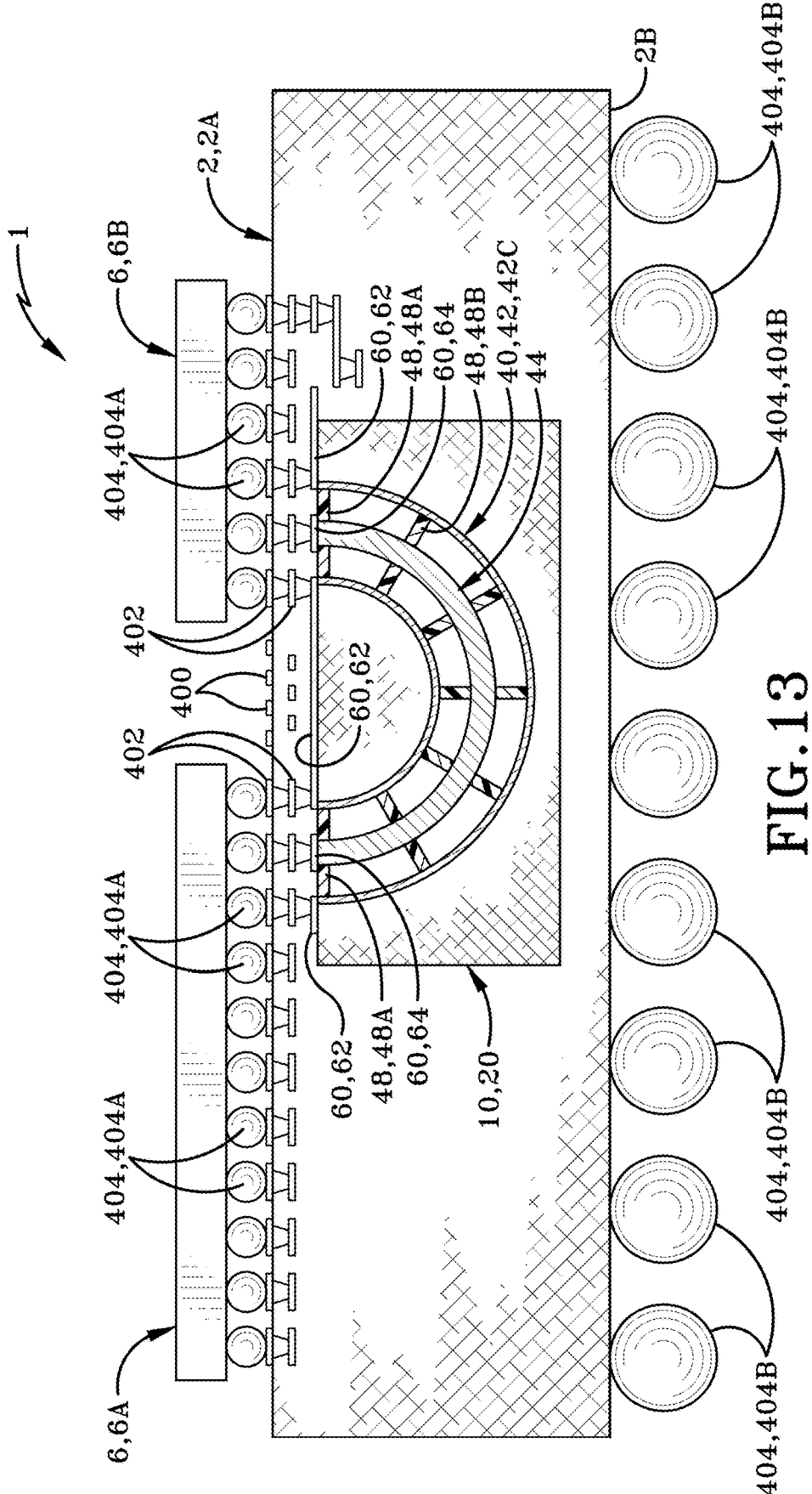
FIG. 13 is an operational view of the RF bridge (shown in FIG. 2) electrically connecting with a first die and a second die in a first orientation, wherein the RF bridge interconnects the first die and second die with one another.

In one example, interconnect bridge 10 may be operably engaged with first die 6A and second die 6B via microvia 400 embedded with substrate 2 along with conductive plating 402 formed along the top surface 2A of the substrate 2 (as seen in FIG. 13). Here, the conductive plating 402 may include a lamination pattern, routing traces, drill vias, electroplate conductors, and other suitable conductive materials for electrically connecting dies and RF bridge with one another. As best seen in FIG. 13, microvia 400 is electrically connected with interconnect 40 of interconnect bridge 10 via the bonding elements 60. More particularly, the conductive plating 400 is electrically connected with outer conductor 42 of the interconnect 40 of interconnect bridge 10 via the first set of bonding elements 62, and conductive plating 400 is electrically connected with inner conductor 44 of the interconnect 40 of interconnect bridge 10 via the second set of bonding elements 64.

In this same example, microbumps or conductive pillars 404A may also be operably engaged with the microvia 400 and conductive plate 402 to electrically connect the interconnect bridge 10 with the first die 6A and the second die 6B. Microbumps or conductive pillars 404B may also be operably engaged with the bottom surface 2B of substrate 2 for electrically connecting IC package 1 with another IC package or other suitable electrical devices and/or components. Once first and second dies 6A, 6B and interconnect bridge 10 are electrically connected as shown in FIG. 13, first and second dies 6A, 6B may then output and/or send signals along a curvilinear signal path defined by the curvilinear-shaped interconnect 40.

Figure 16:
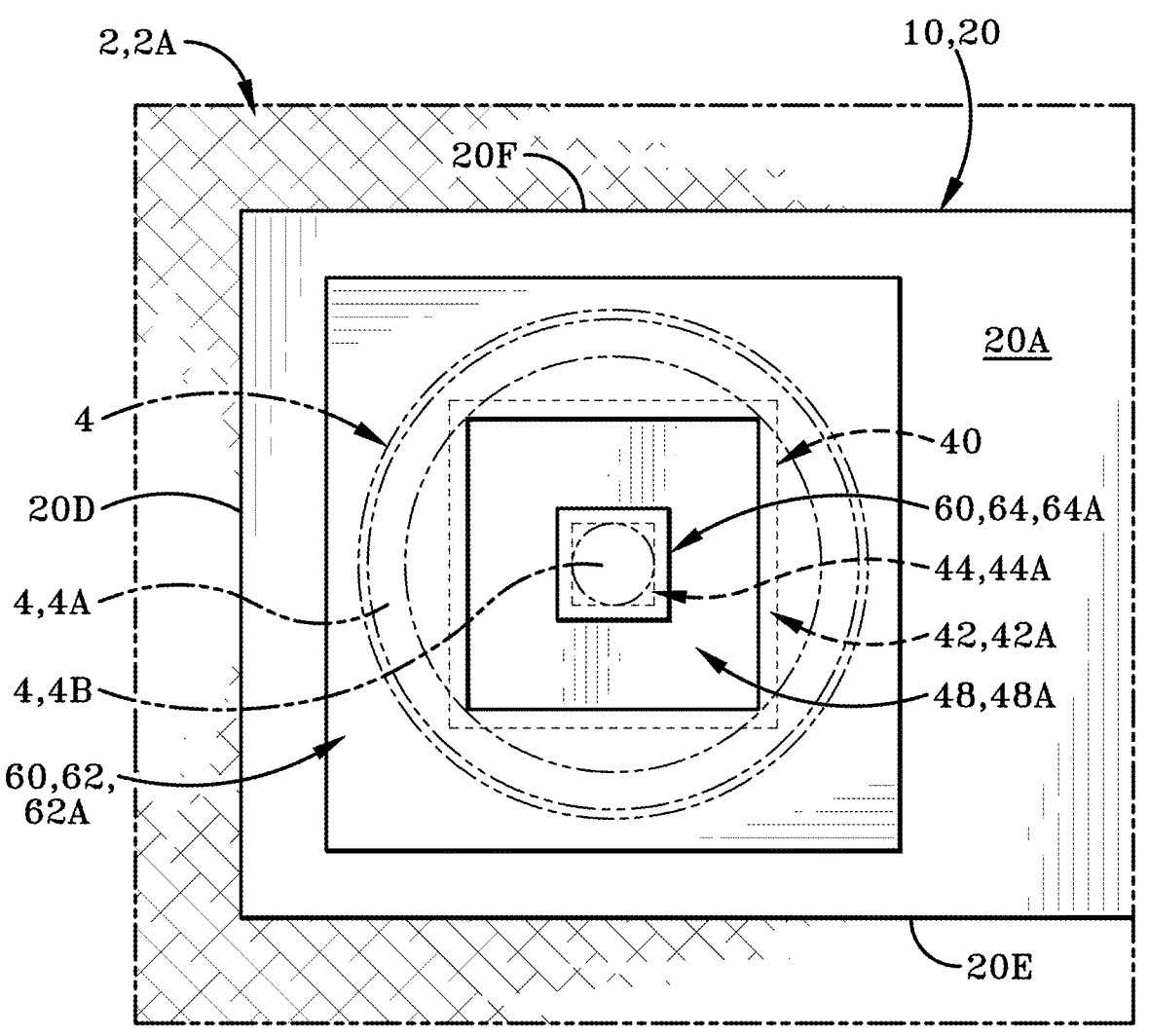
FIG. 16 is sectional view of the RF bridge taken in the direction of lines 16-16 shown in FIG. 15.
Figure 17:
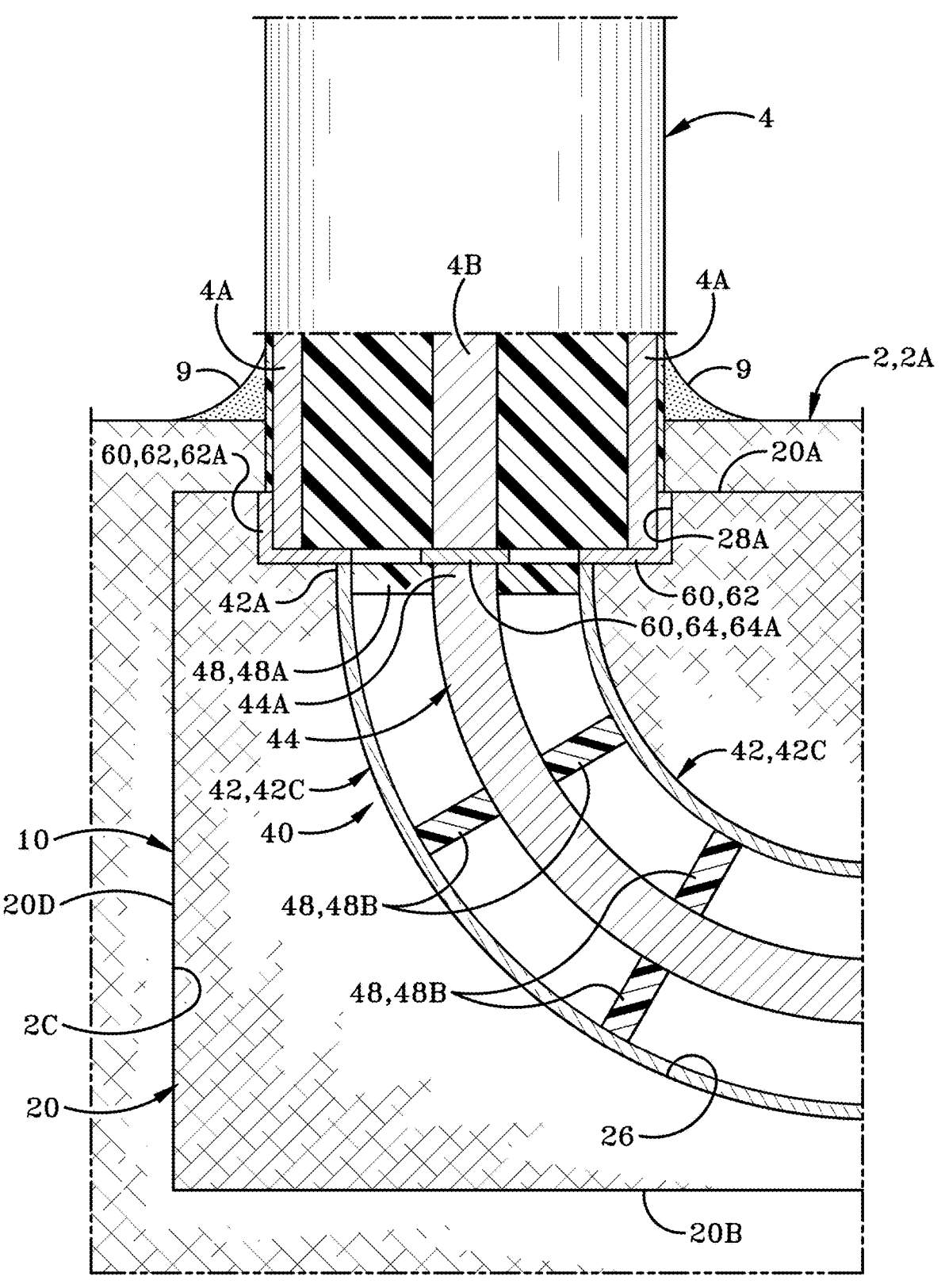
FIG. 17 is another operational view similar to FIG. 15, but a portion of the coaxial cable is housed inside of the RF bridge.

In another example, interconnect bridge 10 may be operably engaged with the coaxial cable 4 once embedded in substrate 2. As best seen in FIGS. 15-17, an outer conductor 4A of coaxial cable 4 operably engages with the first bonding element 62A of the first set of bonding elements 62. Such engagement between the outer conductor 4A and the first bonding element 62A also electrically connects the outer conductor 4A with the outer conductor 42 of interconnect 40 via the first bonding element 62A. Still referring to FIGS. 15-17, an inner conductor 4B of coaxial cable 4 operably engages with the first bonding element 64A of the second set of bonding elements 64. Such engagement between the inner conductor 4B and the first bonding element 64A also electrically connects the inner conductor 4B with the inner conductor 44 of interconnect 40 via the first bonding element 64A. Once the coaxial cable 4 rests on the interconnects 40 and the set of bonding elements 60, bonding material 9 (e.g., epoxy, resin, or similar bonding material of the like) may be used to operably engage the coaxial cable 4 with the substrate 2 to maintain the electrical connection between the coaxial cable 4 and interconnect bridge 10.

In regards to the example discussed above, the coaxial cable 4 may be operably engaged with the interconnect bridge 10 inside and/or outside the body 20 of the interconnect bridge 10 based on the configuration of interconnect bridge 10. In one instance, coaxial cable 4 is operably engaged with the interconnect bridge 10 where the coaxial cable 4 is positioned outside of the body 20 (see FIGS. 15 and 16). More particularly, coaxial cable 4 is operably engaged with the interconnect bridge 10 where the coaxial cable 4 is positioned outside of the passageway 26 defined in body 20 and outside of the first aperture 28A defined in body 20. In this particular example, the set of bonding elements 60 are substantially planar and/or flat in which the set of bonding elements 60 rests on the interfacing surface 20A of body 20. In another instance, coaxial cable 4 is operably engaged with the interconnect bridge 10 where the coaxial cable 4 is positioned partially inside of the body 20 (see FIG. 17). More particularly, coaxial cable 4 is operably engaged with the interconnect bridge 10 where the coaxial cable 4 is positioned inside of the first aperture 28A defined in body 20. In this particular example, the set of bonding elements 60 are L-shaped in which the set of bonding elements 60 are positioned inside of the body 20 and/or positioned interior to the interfacing surface 20A.

In yet another example, coaxial cable 4 and interconnect bridge 10 may be interconnected with one another via another interconnect bridge 10'. As best seen in FIG. 18, interconnect bridge 10' is configured to provide a substantially right-angle design to electrically interconnect the coaxial cable 4 with the interconnect bridge 10. In this example, the coaxial cable 4 may be introduced with the interconnect bridge 10' at the first interfacing surface 20A1' of body 20'. Once introduced, the outer conductor 4A of coaxial cable 4 operably engages with a first bonding element 62A' of a first set of bonding elements 62' of interconnect bridge 10'. Such engagement between the outer conductor 4A and the first bonding element 62A' also electrically connects the outer conductor 4A with the outer conductor 42' of interconnect 40' via the first bonding element 62A'. The inner conductor 4B of coaxial cable 4 also operably engages with a first bonding element 64A' of a second set of bonding elements 64'. Such engagement between the inner conductor 4B and the first bonding element 64A' also electrically connects the inner conductor 4B with the inner conductor 44' of interconnect 40' via the first bonding element 64A'. Once the coaxial cable 4 rests on the interconnects 40' and the set of bonding elements 60' and inside of body 20', bonding material 9 (e.g., epoxy, resin, or similar bonding material of the like) may be used to operably engage the coaxial cable 4 with the interconnect bridge 10' to maintain the electrical connection between the coaxial cable 4 and interconnect bridge 10'.

Still referring to FIG. 18, the combination of the coaxial cable 4 and interconnect bridge 10' may then be introduced to interconnect bridge 10 embedded in substrate 2. Once introduced, a second bonding element 62B' of the first set of bonding elements 62' of interconnect bridge 10' contacts the first bonding element 62A of first set of bonding elements 62 of interconnect bridge 10. Such engagement between second bonding element 62B' of interconnect bridge 10' and first bonding element 62A of interconnect bridge 10 electrically connects the combination of the outer conductor 4A of coaxial cable 4 and outer conductor 42' of interconnect bridge 10' with outer conductor 42 of interconnect bridge 10. A second bonding element 64B' of the second set of bonding elements 64' of interconnect bridge 10' contacts the first bonding element 64A of second set of bonding elements 64 of interconnect bridge 10. Such engagement between second bonding element 64B' of interconnect bridge 10' and first bonding element 64A of interconnect bridge 10 electrically connects the combination of the inner conductor 4B of coaxial cable 4 and inner conductor 44' of interconnect bridge 10' with inner conductor 44 of interconnect bridge 10. Once the interconnect bridge 10' rests on interconnect bridge 10, bonding material 9 (e.g., epoxy, resin, or similar bonding material of the like) may be used to operably engage the interconnect bridge 10' with the interconnect bridge 10 to maintain the electrical connection between the RF bridges 10, 10'.

Figure 14:
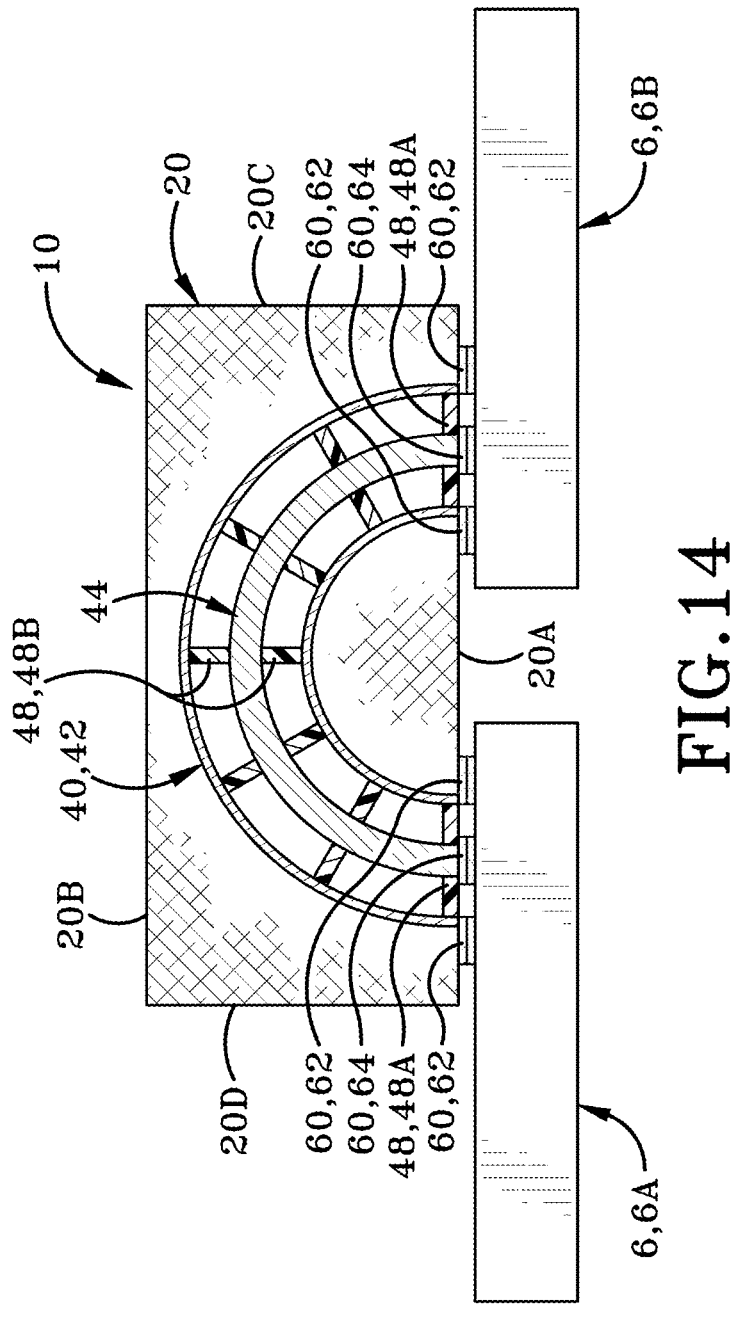
FIG. 14 (is an operational view of the RF bridge (shown in FIG. 2) electrically connecting with a first die and a second die in a first orientation, wherein the RF bridge interconnects the first die and second die with one another.

In yet another example, interconnect bridge 10 may be free from engaging the substrate 2 to interconnect a coaxial cable with at least one die or to interconnect at least two die. As best seen in FIG. 14, interconnect bridge 10 may be inverted 180 degrees in order to interconnect the first die 6A and the second die 6B. In this particular example, the first die 6A may include an outer bonding element 6A1 and an inner bonding element 6A2 that engages with first bonding element 62A of first set of bonding elements 62 and first bonding element 64A of second set of bonding elements 64 of interconnect bridge 10. Upon such engagement, the interconnect 40 of interconnect bridge 10 electrically connects with the first die 6A. More particularly, the outer conductor 42 and the inner conductor 44 of interconnect 40 electrically connects with the first die 6A. Similarly, the second die 6B may include an outer bonding element 6B1 and an inner bonding element 6B2 that engages with second bonding element 62B of first set of bonding elements 62 and second bonding element 64B of second set of bonding elements 64 of interconnect bridge 10. Upon such engagement, the interconnect 40 of interconnect bridge 10 electrically connects with the second die 6B. More particularly, the outer conductor 42 and the inner conductor 44 of interconnect 40 electrically connects with the second die 6B. With such interconnection, the interconnect bridge 10 enables a curvilinear signal path between the first die 6A and the second die 6B.

In this manufacturing instance, any suitable bonding technique with desired bonding materials may be used to bond the interconnect bridge 10 with dies 6A, 6B. Examples of suitable bonding materials for bonding the interconnect bridge 10 with dies 6A, 6B include bonding metal alloys, conductive epoxies, silver sintering nanoparticles, and other materials compatible with photonic curing may be used herein for bonding the interconnect bridge 10 with dies 6A, 6B.

It should be appreciated that interconnect bridges 10, 110, 210, 310 described and illustrated may also be used with other electrical cables having a single conductor for reducing electromagnetic field interference (EMI) and radio frequency interference (RFI) in an electrical signal conduction path or a non-electrical signal conduction path. Examples of suitable electrical or non-electrical cables having a single conductor that may be used with interconnect bridges described and illustrated herein include fiber optic (FO) cable and shielded twisted pair (STP) cable or unshielded twisted pair (UTP) cable. With such non-electrical cables, methods of manufacturing described and illustrated herein may be used to form optical path that includes a single or multimode fiber having a core and cladding. Once manufactured, this optical bridge for a FO cable may be used between or on photonic integrated circuits. In one instance, a printed electronics approach, such as electrochemical additive manufacturing (ECAM) may be a desired and/or appropriate approach when providing a UTP structure or a STP structure between die.

FIG. 19 is a method 500 for interconnecting at least one electrical component with at least another electrical component via a radio frequency (RF) bridge. Initial step 502 of method 500 may include providing a body of the RF bridge, wherein the body includes an interfacing surface and a bonding surface extending from the interfacing surface. Another step 504 of method 500 may include providing an interconnect of the RF bridge with the body, wherein the interconnect includes at least one electrical connection positioned at the interfacing surface and at least another electrical connection positioned at the interfacing surface adjacent with the at least one electrical connection, and wherein the interconnect extends curvilinearly between the at least one electrical connection and the at least another electrical connection to create a curvilinear signal path. Another step 506 of method 500 may include interconnecting the at least one electrical component with the at least another electrical component via the RF bridge.

Method 500 may include additional or optional steps for interconnecting at least one electrical component with at least another electrical component via a radio frequency (RF) bridge. Optional steps may further include that the steps of providing the body of the RF bridge and providing the interconnect with the body further comprises: providing a base layer of the RF bridge that includes a first conductive material for the interconnect; providing at least one intermediate layer of the RF bridge operably engaged with the base layer and including an outer conductor of the interconnect, an inner conductor of the interconnect, and a plurality of dielectric supports of the interconnect; and providing a top layer operably engaged with the at least one intermediate layer and including a second conductive material for the interconnect. Optional steps may further include that the steps of providing the body of the RF bridge and providing the interconnect with the body further comprises: providing a base layer of the RF bridge that includes a first conductive material for the interconnect; providing a first intermediate layer with the base layer and includes an outer conductor and a set of outer dielectric supports of the plurality of dielectric supports; providing a second intermediate layer with the first intermediate layer and includes the outer conductor, an inner conductor, the set of outer dielectric supports of the plurality of dielectric supports, and a set of inner dielectric supports of the plurality of dielectric supports; providing a third intermediate layer with the second intermediate layer and includes the outer conductor and the set of outer dielectric supports of the plurality of dielectric supports; and providing a top layer operably engaged with the at least one intermediate layer and including a second conductive material for the interconnect. Optional steps may further include connecting a coaxial cable with the interconnect via the at least one electrical connection; and connecting a die with the interconnect via the at least another electrical connection; wherein the coaxial cable and the die are interconnected with one another via the interconnect. Optional steps may further include connecting a first die, via the at least one electrical connection, with the interconnect; and connecting a second die, via the at least another electrical connection, with the interconnect; wherein the first die and the second die are interconnected with one another via the interconnect. Optional steps may further include engaging a first set of bonding elements with the interfacing surface proximate to the at least one electrical connection; engaging a second set of bonding elements with the interfacing surface proximate to the at least another electrical connection; and engaging a third set of bonding elements with the interconnect at the at least one electrical connection and the at least another electrical connection. An optional step may further include engaging the bonding surface of the body with a substrate, wherein the body and the interconnect are positioned inside of a cavity defined by the substrate. Optional steps may further include introducing a second RF bridge having a second body and a second interconnect; connecting the second interconnect of the second RF bridge with the interconnect of the RF bridge; connecting a coaxial cable with the second interconnect of the second RF bridge; and connecting a die with the interconnect of the RF bridge; wherein the coaxial cable and the die are interconnected with one another via the RF bridge and the second RF bridge.

While RF bridges described and illustrated herein are disposed inside of organic laminate substrates, such RF bridges may be disposed inside of other suitable components made of commercially available materials used in this art. In one instance, RF bridges may be disposed inside of a glass component. In one instance, RF bridges may be disposed inside of a ceramic component.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

To the extent that the present disclosure has utilized the term "invention" in various titles or sections of this specification, this term was included as required by the formatting requirements of word document submissions pursuant the guidelines/requirements of the United States Patent and Trademark Office and shall not, in any manner, be considered a disavowal of any subject matter.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A radio frequency (RF) bridge, comprising:
an interfacing surface of a body;
a first bonding surface of a set of bonding surfaces of the body extending from the interfacing surface,
a second bonding surface of the set of bonding surfaces of the body opposite to the first bonding surface and extending from the interfacing surface,
a third bonding surface of the set of bonding surfaces of the body extending between the first bonding surface and the second bonding surface; and
a curvilinear interconnect internally operably engaged with the body, the interconnect having at least one electrical connection positioned at the interfacing surface and proximate to the first bonding surface and at least another electrical connection positioned at the interfacing surface and proximate to the second bonding surface adjacent with the at least one electrical connection;
wherein the interconnect extends curvilinearly between the at least one electrical connection and the at least another electrical connection inside of the body providing a curvilinear signal path.

2. The RF bridge of claim 1, wherein the at least one electrical connection is configured to electrically connect with a die; and
wherein the at least another electrical connection is configured to electrically connect with a cable such that the coaxial cable and the die are interconnected with one another via the interconnect.

3. The RF bridge of claim 1, wherein the at least one electrical connection is configured to electrically connect with a first die; and
wherein the at least another electrical connection is configured to electrically connect with a second die such that the first die and the second die are interconnected with one another via the interconnect.

4. The RF bridge of claim 1, wherein the interconnect comprises:

a curvilinear outer conductor extending between the at least one electrical connection and the at least another electrical connection.

5. The RF bridge of claim 4, wherein the interconnect further comprises:

a curvilinear inner conductor positioned inside of the outer conductor and extending between the at least one electrical connection and the at least another electrical connection.

6. The RF bridge of claim 5, wherein the interconnect further comprises:

a curvilinear dielectric defined by the outer conductor and extending between the at least one electrical connection and the at least another electrical connection.

7. The RF bridge of claim 6, wherein the interconnect further comprises:

a plurality of dielectric supports operably engaged with the outer conductor and the inner conductor;

wherein the plurality of dielectric supports suspends the inner conductor inside of the outer conductor.

8. The RF bridge of claim 1, wherein the body comprises:

a first aperture defined in the interfacing surface and configured to receive the at least one electrical connection;

a second aperture defined in the interfacing surface and configured to receive the at least another electrical connection; and a curvilinear passageway defined in the body and extending from the first aperture to the second aperture and configured to house the interconnect inside of the body.

9. The RF bridge of claim 1, further comprising:

a base layer of the body including a first conductive material for the interconnect;

at least one intermediate layer of the body operably engaged with the base layer and including an outer conductor of the interconnect, an inner conductor of the interconnect, and a plurality of dielectric supports of the interconnect; and a second support layer of the body operably engaged with the at least one intermediate layer and including a second conductive material for the interconnect;

wherein the first conductive material and the second conductive material are the same.

10. The RF bridge of claim 9, wherein the at least one intermediate layer of the body comprises:

a first intermediate layer of the body operably engages with the base layer and includes the outer conductor and a set of outer dielectric supports of the plurality of dielectric supports.

11. The RF bridge of claim 10, further comprising:

a second intermediate layer of the body operably engages with the first intermediate layer and includes the outer conductor, the inner conductor, the set of outer dielectric supports of the plurality of dielectric supports, and a set of inner dielectric supports of the plurality of dielectric supports.

12. The RF bridge of claim 11, further comprising:

a third intermediate layer of the body operably engages with the second intermediate layer and includes the outer conductor and the set of outer dielectric supports of the plurality of dielectric supports.

13. A radio-frequency (RF) bridge, comprising:

a body having a pair of base layers and at least one intermediate layer positioned between the pair of base layers, wherein the body has a set of bonding surfaces and an interfacing surface;

a first connector on the interfacing surface;

a second connector on the interfacing surface; and a curvilinear interconnect electrically coupling the first connector to the second connector, wherein the curvilinear interconnect comprises one or more curvilinear passageways internal to the body providing a curvilinear signal path.

14. The RF bridge of claim 13, wherein the interconnect further comprises:

a curvilinear outer conductor extending between the at least one electrical connection and the at least another electrical connection;

a curvilinear inner conductor positioned inside of the outer conductor and extending between the at least one electrical connection and the at least another electrical connection; and a curvilinear dielectric defined by the outer conductor and extending between the at least one electrical connection and the at least another electrical connection.

15. The RF bridge of claim 13, wherein the interconnect further comprises:

a plurality of dielectric supports operably engaged with the outer conductor and the inner conductor;

wherein the plurality of dielectric supports suspends the inner conductor inside of the outer conductor.

16. A method of interconnecting at least one electrical component with at least another electrical component via a radio frequency (RF) bridge, comprising:

providing a body of the RF bridge, wherein the body includes an interfacing surface and a bonding surface extending from the interfacing surface;

providing an interconnect of the RF bridge with the body, wherein the interconnect includes at least one electrical connection positioned at the interfacing surface and at least another electrical connection positioned at the interfacing surface adjacent with the at least one electrical connection, and wherein the interconnect extends curvilinearly between the at least one electrical connection and the at least another electrical connection to create a curvilinear signal path; and interconnecting the at least one electrical component with the at least another electrical component via the RF bridge.

17. The method of claim 16, further comprising:

providing a base layer of the RF bridge that includes a first conductive material for the interconnect;

providing at least one intermediate layer of the RF bridge operably engaged with the base layer and including an outer conductor of the interconnect, an inner conductor of the interconnect, and a plurality of dielectric supports of the interconnect; and providing a top layer operably engaged with the at least one intermediate layer and including a second conductive material for the interconnect.

18. The method of claim 16, further comprising:

providing a base layer of the RF bridge that includes a first conductive material for the interconnect;

providing a first intermediate layer with the base layer and includes an outer conductor and a set of outer dielectric supports of the plurality of dielectric supports;

providing a second intermediate layer with the first intermediate layer and includes the outer conductor, an inner conductor, the set of outer dielectric supports of the plurality of dielectric supports, and a set of inner dielectric supports of the plurality of dielectric supports;

providing a third intermediate layer with the second intermediate layer and includes the outer conductor and the set of outer dielectric supports of the plurality of dielectric supports; and providing a top layer operably engaged with the at least one intermediate layer and including a second conductive material for the interconnect.

19. The method of claim 16, further comprising:

connecting a coaxial cable with the interconnect via the at least one electrical connection; and connecting a die with the interconnect via the at least another electrical connection;

wherein the coaxial cable and the die are interconnected with one another via the interconnect.

20. The method of claim 16, further comprising:

engaging the bonding surface of the body with a substrate, wherein the body and the interconnect are positioned inside of a cavity defined by the substrate.

\* \* \* \* \*